(12) United States Patent
Lee et al.

(10) Patent No.: US 12,062,395 B2
(45) Date of Patent: Aug. 13, 2024

(54) NONVOLATILE MEMORY DEVICE WITH CONFIGURATION TO APPLY ADJUSTABLE VOLTAGE TO PASS TRANSISTOR GATE

(71) Applicant: Samsung Electronics Co., Ltd., Suwon-si (KR)

(72) Inventors: Yohan Lee, Incheon (KR); Chaehoon Kim, Gwacheon-si (KR); Jungyun Yun, Seoul (KR); Jiho Cho, Suwon-si (KR); Sanggi Hong, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 193 days.

(21) Appl. No.: 17/750,642

(22) Filed: May 23, 2022

(65) Prior Publication Data

US 2023/0134907 A1    May 4, 2023

(30) Foreign Application Priority Data

Nov. 4, 2021  (KR) .................. 10-2021-0150267

(51) Int. Cl.
  *G11C 16/14*  (2006.01)
  *G11C 16/04*  (2006.01)
  (Continued)

(52) U.S. Cl.
  CPC .......... *G11C 16/14* (2013.01); *G11C 16/0483* (2013.01); *G11C 16/08* (2013.01);
  (Continued)

(58) Field of Classification Search
  CPC ......... G11C 16/26; G11C 16/16; G11C 16/08; G11C 7/04; G11C 16/14; G11C 16/10;
  (Continued)

(56) References Cited

U.S. PATENT DOCUMENTS 6,337,807 B2   1/2002   Futatsuyama et al.
7,545,680 B2   6/2009   Kim et al.
(Continued)

FOREIGN PATENT DOCUMENTS

JP    2004-0280867 A    10/2004
KR       101075504 B1   10/2011
KR   10-2020-0093481 A   8/2020

OTHER PUBLICATIONS

Partial European Search Report issued on Nov. 22, 2022 in European Application No. 22176441.8.
(Continued)

*Primary Examiner* — Tuan T Nguyen
(74) *Attorney, Agent, or Firm* — Harness, Dickey & Pierce, P.L.C.

(57) ABSTRACT

A nonvolatile memory device includes a memory block and a control circuit. The memory block includes a plurality of cell strings where each of the plurality of cell strings includes a string selection transistor, a plurality of memory cells and a ground selection transistor which are connected in series and disposed in a vertical direction between a bit-line and a common source line. The control circuit adjusts a level of a high voltage applied to a gate of a pass transistor of a selected word-line such that a voltage difference between the high voltage and a program voltage applied to a drain of the pass transistor differs in at least a portion of a plurality of program loops based on a comparison of a number of the program loops and a reference number during a program operation on a target memory cells.

11 Claims, 35 Drawing Sheets

(51) Int. Cl.
*G11C 16/08* (2006.01)
*G11C 16/30* (2006.01)
*G11C 11/56* (2006.01)
*G11C 16/34* (2006.01)

(52) U.S. Cl.
CPC .......... *G11C 16/30* (2013.01); *G11C 11/5628* (2013.01); *G11C 16/3445* (2013.01); *G11C 16/3459* (2013.01)

(58) Field of Classification Search
CPC ..... G11C 8/08; G11C 16/349; G11C 16/0483; G11C 16/30; G11C 16/3418; G11C 16/3459; G11C 11/5628; G11C 16/3445
See application file for complete search history.

(56) References Cited

U.S. PATENT DOCUMENTS

| | | | |
|---|---|---|---|
| 7,898,851 B2 | 3/2011 | Maejima et al. | |
| 9,299,443 B1 | 3/2016 | Dong et al. | |
| 9,508,441 B1 | 11/2016 | Nam et al. | |
| 2006/0291292 A1 | 12/2006 | Kwon et al. | |
| 2009/0257280 A1 | 10/2009 | Oh et al. | |
| 2014/0321209 A1* | 10/2014 | Yun | G11C 16/3404 365/185.12 |
| 2015/0117133 A1 | 4/2015 | Yoo | |
| 2016/0064083 A1* | 3/2016 | Nam | G11C 16/0483 365/185.11 |
| 2016/0099068 A1* | 4/2016 | Kwak | G11C 16/14 365/185.25 |
| 2016/0260489 A1* | 9/2016 | Lee | G11C 16/3427 |
| 2020/0118629 A1 | 4/2020 | Kim et al. | |
| 2020/0402584 A1 | 12/2020 | Lee | |
| 2021/0065802 A1 | 3/2021 | Rabkin et al. | |
| 2021/0217477 A1* | 7/2021 | Shim | G11C 16/0483 |
| 2021/0272617 A1* | 9/2021 | Kang | G11C 7/12 |

OTHER PUBLICATIONS

Extended European Search Report issued on Feb. 7, 2023 in European Application No. 22176441.8.

* cited by examiner

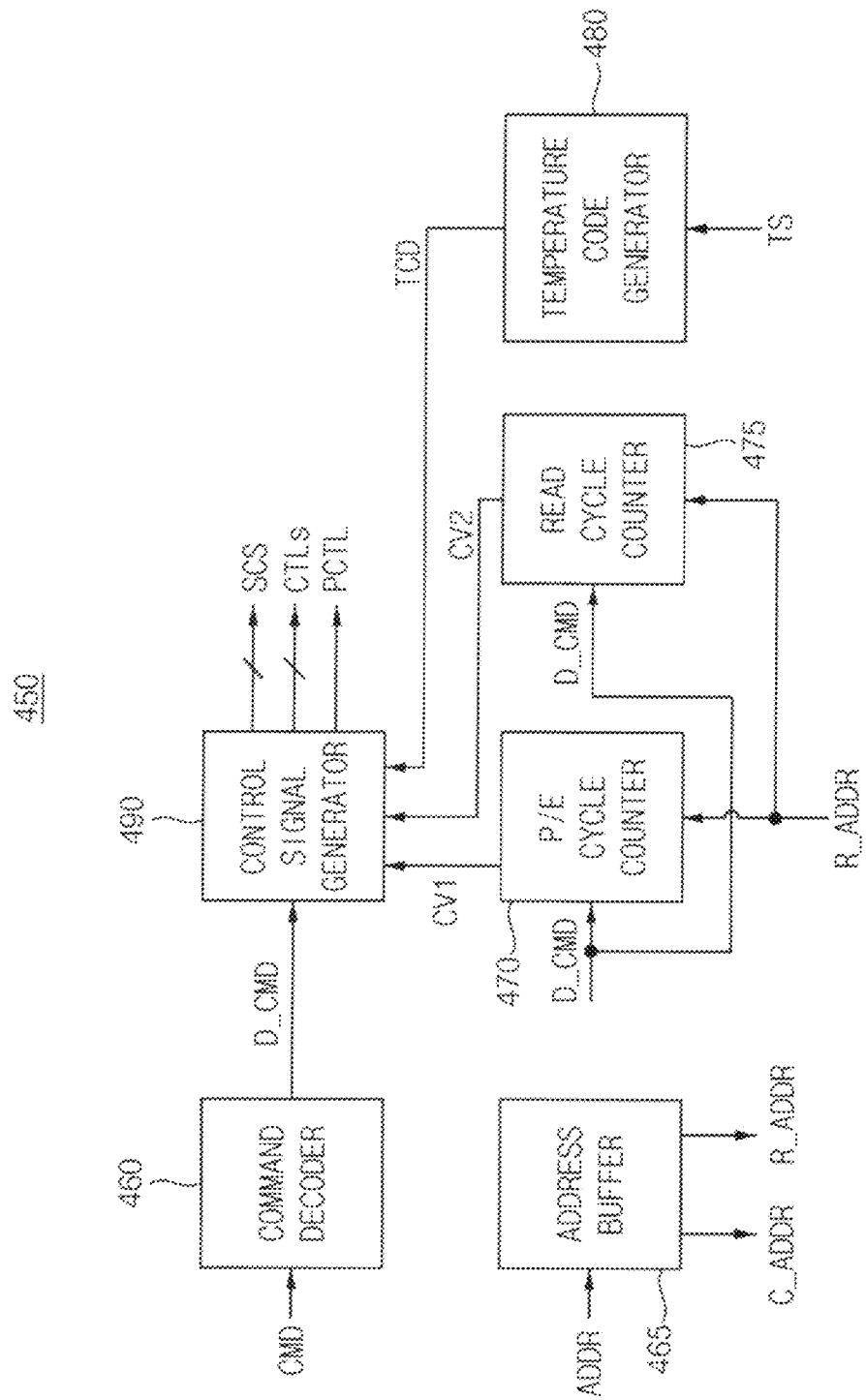

FIG. 31
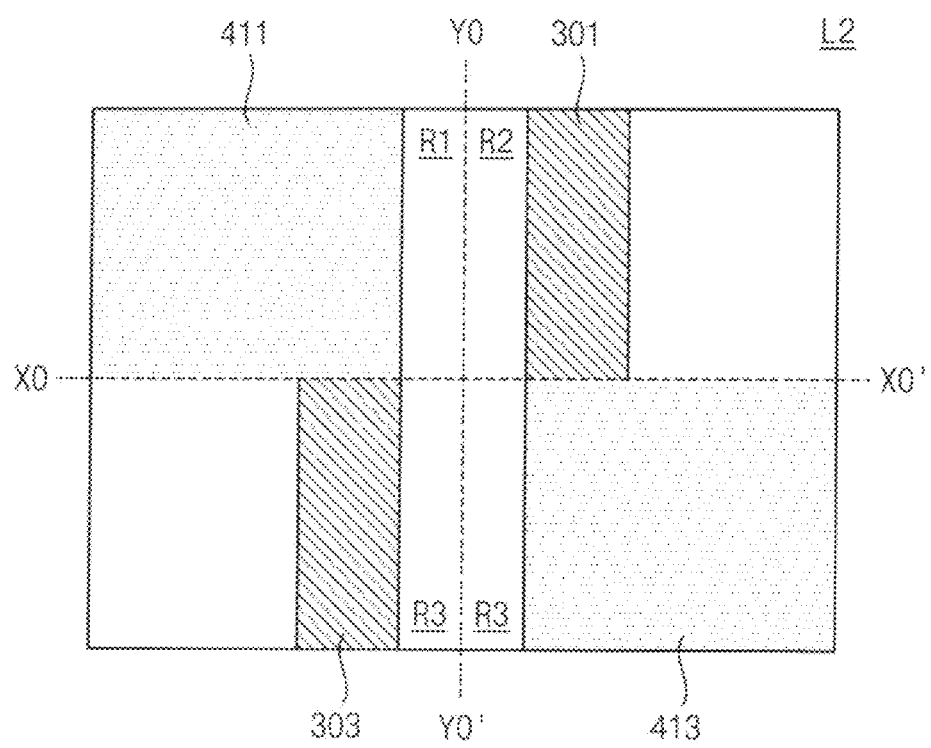
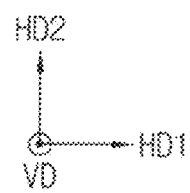

NONVOLATILE MEMORY DEVICE WITH CONFIGURATION TO APPLY ADJUSTABLE VOLTAGE TO PASS TRANSISTOR GATE

CROSS-REFERENCE TO RELATED APPLICATION

This US application claims priority under 35 USC § 119 to Korean Patent Application No. 10-2021-0150267, filed on Nov. 4, 2021, in the Korean Intellectual Property Office (KIPO), the disclosure of which is incorporated in its entirety by reference herein.

BACKGROUND

1. Technical Field

Example embodiments generally relate to memory devices, and more particularly to nonvolatile memory devices.

2. Discussion of the Related Art

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices. Along with increases in the integration degree and memory capacity, operating performance of the nonvolatile memory devices may be degraded.

SUMMARY

Some example embodiments may provide a nonvolatile memory device capable of enhancing performance of a program operation by adjusting a level of a high voltage applied to gates of pass transistors.

Some example embodiments may provide a nonvolatile memory device capable of enhancing performance of an erase operation by adjusting a level of a high voltage applied to gates of pass transistors.

Some example embodiments may provide a nonvolatile memory device capable of enhancing performance of a read operation by adjusting a level of a high voltage applied to gates of pass transistors.

According to some example embodiments, a nonvolatile memory device includes at least one memory block and a control circuit. The least one memory block includes a plurality of cell strings, and each of the plurality of cell strings includes a string selection transistor, a plurality of memory cells, and a ground selection transistor connected in series between a bit-line and a common source line in a vertical direction. The control circuit is configured to, during a program operation on target memory cells, adjust a level of a high voltage applied to a gate of a pass transistor of a selected word-line of the plurality of cell strings such that a voltage difference between the high voltage and a program voltage applied to a drain of the pass transistor differs in at least a portion of a plurality of program loops based on a comparison of a number of the program loops and a reference number. The number of the program loops is based on at least one of program/erase cycle information of the target memory cells or a number of a plurality of target program states of the target memory cell.

According to some example embodiments, a nonvolatile memory device includes at least one memory block and a control circuit. The least one memory block includes a plurality of cell strings, and each of the plurality of cell strings includes a string selection transistor, a plurality of memory cells, and a ground selection transistor connected in series between a bit-line and a common source line in a vertical direction. The control circuit is configured to, during an erase operation on the at least one memory block, adjust a level of a first high voltage applied to a gate of a first pass transistor coupled to the common source line and a level of a second high voltage applied to a gate of a second pass transistor coupled to the bit-line such that the level of the first high voltage differs from the level of the second high voltage, apply an erase voltage to drains of the first pass transistor and the second pass transistor, and apply a word-line erase voltage to at least a portion of word-lines coupled to the plurality of memory cells. The levels of the first high voltage and the second high voltage are adjusted based on at least one of program/erase cycle information or an operating temperature during the erase operation on the at least one memory block According to example embodiments, a nonvolatile memory device includes at least one memory block and a control circuit. The least one memory block includes a plurality of cell strings, and each of the plurality of cell strings includes a string selection transistor, a plurality of memory cells, and a ground selection transistor connected in series between a bit-line and a common source line in a vertical direction. The control circuit is configured to, during a read operation on a target memory cells, adjust a level of a high voltage, applied to each gate of pass transistors coupled to a plurality of word-lines coupled to the plurality of memory cells to have a first level, in a word-line set-up interval, applying a pass voltage to unselected word-lines among the plurality of word-lines, apply a read voltage to a selected word-line among the plurality of word-lines, and adjust the level of the high voltage to have a second level smaller than the first level after the read voltage and the pass voltage arrive at respective target levels. The first and second levels are based on at least one of read cycle information of the target memory cells or an operating temperature during the read operation on the target memory cells Therefore, the nonvolatile memory device adjusts a level of a high voltage such that a voltage difference between the high voltage applied to a gate of the pass transistor and a program voltage applied to a drain of the pass transistor during a program operation, adjusts a first level of a first high voltage applied to a gate of a pass transistor coupled to a common source line and a second level of a second high voltage applied to a gate of a pass transistor coupled to a bit-line such that the levels of the first high voltage and the second high voltage differ during an erase operation and adjust a level of a high voltage applied to each gate of pass transistors coupled to unselected word-lines during a read operation. The nonvolatile memory device may enhance performance.

BRIEF DESCRIPTION OF THE DRAWINGS

Illustrative, non-limiting example embodiments will be more clearly understood from the following detailed description in conjunction with the accompanying drawings.

FIG. 9A is a block diagram illustrating the control circuit in the nonvolatile memory device of FIG. 3 according to some example embodiments.

FIG. 31 is a plan view illustrating a top surface of the second semiconductor layer contacting the first semiconductor layer of the nonvolatile memory device according to some example embodiments.

DETAILED DESCRIPTION OF THE EMBODIMENTS

Figure 1:
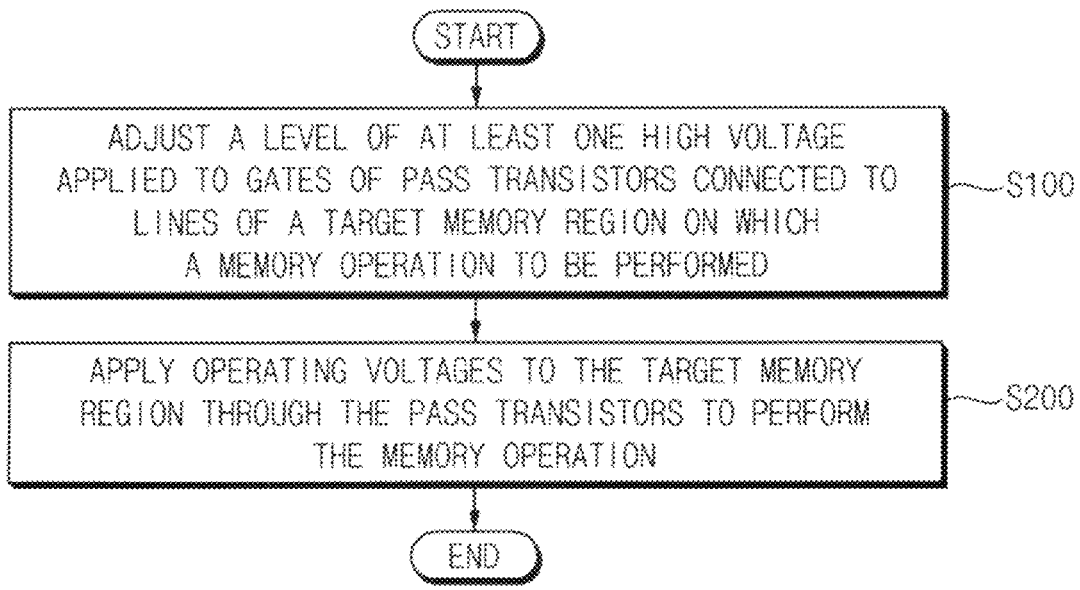
FIG. 1 is a flow chart illustrating a method of operating a nonvolatile memory device according to some example embodiments.

Various example embodiments will be described more fully hereinafter with reference to the accompanying drawings, wherein like reference numerals refer to like elements throughout. In this regard, the present embodiments may have different forms and should not be construed as being limited to the descriptions set forth herein. Throughout the drawings, the size or thickness of each constituent element illustrated in the drawings may be exaggerated for convenience of explanation and clarity.

FIG. 1 is a flow chart illustrating a method of operating a nonvolatile memory device according to some example embodiments.

FIG. 1 illustrates a method of operating a nonvolatile memory device including at least one memory block which includes a plurality of cell strings, where each cell string includes a string selection transistor, a plurality of memory cells and a ground selection transistor connected between a bit-line and a common source line. According to some example embodiments, the nonvolatile memory device may include a three-dimensional NAND flash memory device and/or a vertical NAND flash memory device.

Referring to FIG. 1, a control circuit in the nonvolatile memory device adjusts a level of a high voltage applied to each gate of pass transistors connected to lines of a target memory region on which a memory operation is to be performed (operation S100).

The memory operation, may include at least one of a program operation, an erase operation, and/or a read operation. The lines may include a bit-line, a common source line, word-lines coupled to memory cells, a strings selection line coupled to a string selection transistor, and a gate selection line coupled to a gate selection transistor.

When the memory operation corresponds to either the program operation and/or the read operation, the target memory region may correspond to a page coupled to a selected word-line.

When the memory operation corresponds to the erase operation, the target memory region may correspond to a memory block. The control circuit may perform the erase operation on the entire memory block and/or a portion of the memory block.

The control circuit performs the memory operation by applying operating voltages to the target memory region through the pass transistors (operation S200).

When the memory operation corresponds to the program operation, the control circuit adjusts the level of the high voltage such that a high voltage applied to each gate of pass transistors (coupled to a selected word-line and unselected word-lines) and a program voltage applied to a drain of the pass transistor coupled to the selected word-line have a first voltage difference during first program loops and then have a second voltage difference (smaller than the first voltage difference) during second program loops based on a number of the program loops executed on memory cells coupled to the selected word-line, a plurality of target program states, and/or at least a portion of program states.

Because the second voltage difference in the second program loops is smaller than the first voltage difference in the first program loops, a voltage difference of the program voltage between the first program loops and the second program loops is reduced, and thus threshold voltage distribution of the memory cells to be programmed may be enhanced.

When the memory operation corresponds to the program operation, the control circuit may control the erase operation, based on at least one of program/erase cycle information and/or an operating temperature, by adjusting a first high voltage applied to a gate of a first pass transistor coupled to the common source line and a level of a second high voltage applied to a gate of a second pass transistor coupled to a bit-line such that the first high voltage ramps to a target level and the second high voltage ramps to the target level with a delay, applying an erase voltage to drains of the first pass transistor and the second pass transistor, applying an erase control voltage smaller than the erase voltage to gates of a string selection transistor and a ground selection transistor and by applying a word-line erase voltage to word-lines of a cell string. When the erase operation is performed as mentioned above, holes injected to a channel of the cell string through the common source line and holes injected to the channel through the bit-line may be uniform, and thus erase skew due to loading difference between the common source line and the bit-line and erase speed difference between an upper portion and a bottom portion of the cell string may be reduced.

When the memory operation corresponds to the read operation, the control circuit controls the read operation by adjusting a level of a high voltage applied to each gate of pass transistors coupled to word-lines in a word-line set-up interval to have a first level, applying a pass voltage to unselected word-lines among the word-lines, applying a read voltage to a selected word-lines among the word-lines, and by adjusting the level of the high voltage to have a second level smaller than the first level after the read voltage and the pass voltage arrive at respective target levels. Because, the control circuit lowers the high voltage applied to each gate of the pass transistors coupled to unselected word-lines, reliability of the pass transistors coupled to unselected word-lines may be enhanced and power consumption may be reduced.

Figure 2:
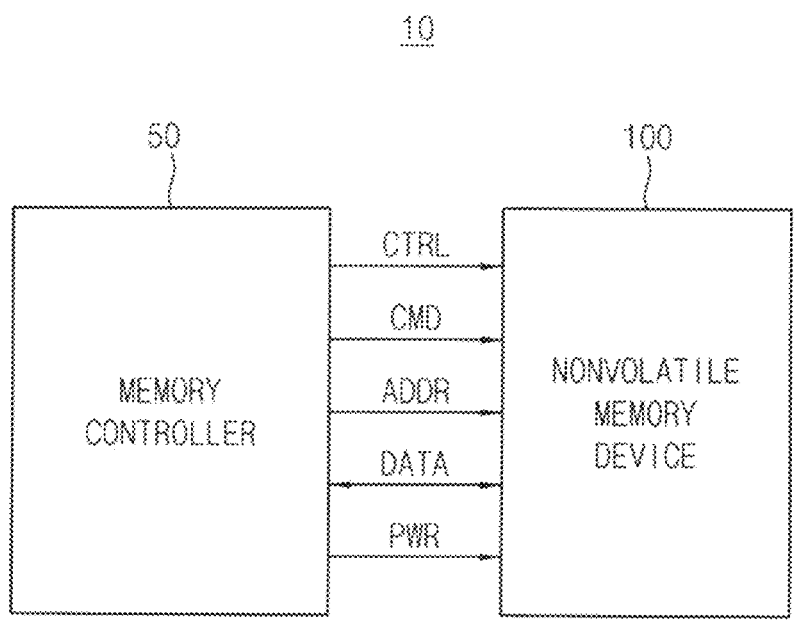
FIG. 2 is a block diagram illustrating a memory system (e.g., a storage device) the according to some example embodiments.

FIG. 2 is a block diagram illustrating a memory system (e.g., a storage device) the according to some example embodiments.

Referring to FIG. 2, the memory system (e.g., the storage device) 10 may include a memory controller 50 and at least one nonvolatile memory device 100.

In example embodiments, each of the memory controller 50 and the nonvolatile memory device 100 may be provided with and/or in the form of a chip, a package, and/or a module. Alternatively, the memory controller 50 and the nonvolatile memory device 100 may be packaged into one of various packages. The memory controller 50 (and/or the nonvolatile memory device 100) may be and/or include, for example, processing circuitry such as hardware, software, or the combination of hardware and software. For example, the processing circuitry more specifically may include (and/or be included in), but is not limited to, a processor (and/or processors), Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), graphics processing unit (GPU), etc.

The nonvolatile memory device 100 may perform an erase operation, a program operation, and/or a write operation under control of the memory controller 50. For example, the nonvolatile memory device 100 receives a command (signal) CMD, an address (signal) ADDR, and/or data (signal) DATA through input/output lines from the memory controller 50 for performing such operations. In addition, the nonvolatile memory device 100 receives a control signal CTRL through a control line from the memory controller 50. In addition, the nonvolatile memory device 100 receives a power PWR through a power line from the memory controller 50.

Figure 3:
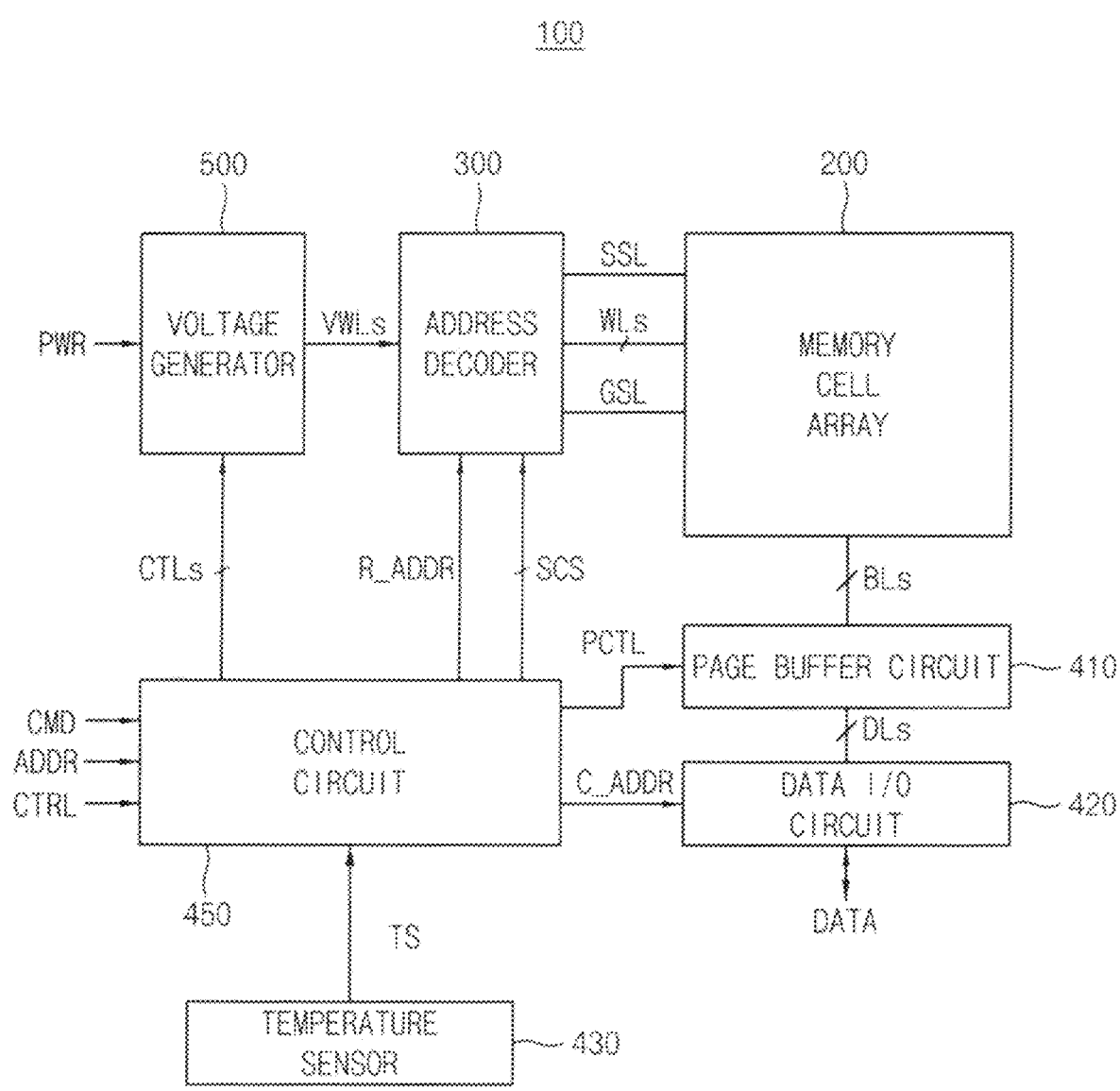
FIG. 3 is a block diagram illustrating the nonvolatile memory device in the memory system of FIG. 2 according to some example embodiments.

FIG. 3 is a block diagram illustrating the nonvolatile memory device in the memory system of FIG. 2 according to some example embodiments.

Referring to FIG. 3, the nonvolatile memory device 100 includes a memory cell array 200, an address decoder 300, a page buffer circuit 410, a data input/output (I/O) circuit 420, a control circuit 450, a voltage generator 500, and a temperature sensor 430.

The memory cell array 200 may be coupled to the address decoder 300 through a string selection line SSL, a plurality of word-lines WLs, and a ground selection line GSL. In addition, the memory cell array 200 may be coupled to the page buffer circuit 410 through a plurality of bit-lines BLs. The memory cell array 200 may include a plurality of memory cells coupled to the plurality of word-lines WLs and the plurality of bit-lines BLs.

In some example embodiments, the memory cell array 200 may be a three-dimensional memory cell array, which is formed on a substrate in a three-dimensional structure and/or a vertical structure. For example, the memory cell array 200 may include vertical cell strings that are vertically oriented such that at least one memory cell is located over another memory cell.

The control circuit 450 may receive a command (signal) CMD, an address (signal) ADDR, and/or a control signal CTRL from the memory controller 50 and may control a user operation of the nonvolatile memory device 100 based on the control (signal) CTRL, the command (signal) CMD, and the address (signal) ADDR. The user operation may include, e.g., an erase loop, a program loop, and/or a read operation of the nonvolatile memory device 100. In some example embodiments, the program loop may include a program operation and a program verification operation. In some example embodiments, the erase loop may include an erase operation and an erase verification operation.

For example, the control circuit 450 may generate control signals CTLs to control the voltage generator 500 and may generate a page buffer control signal PCTL to control the page buffer circuit 410 based on the command signal CMD. The control circuit 450 may generate a row address R_ADDR and a column address C_ADDR based on the address signal ADDR. The control circuit 450 may provide the row address R_ADDR to the address decoder 300 and provide the column address C_ADDR to the data I/O circuit 420. In addition, the control circuit 450 may generate switching control signals SCS based on the command signal CMD and may provide the switching control signals SCS to the address decoder 300.

The address decoder 300 may be coupled to the memory cell array 200 through the string selection line SSL, the plurality of word-lines WLs, and the ground selection line GSL. During the program operation or the read operation, the address decoder 300 may determine one of the plurality of word-lines WLs as a selected word-line and determine rest of the plurality of word-lines WLs except for the selected word-line as unselected word-lines based on the row address R_ADDR.

The voltage generator 500 may generate word-line voltages VWLs, for the operation of the nonvolatile memory device 200, based on the control signals CTLs. The voltage generator 500 may receive the power PWR from the memory controller 50. The word-line voltages VWLs may be applied to the plurality of word-lines WLs through the address decoder 430.

In some example embodiments, during the erase operation, the voltage generator 500 may apply an erase voltage to a well of the memory block and may apply a ground voltage to entire word-lines of the memory block. During the erase verification operation, the voltage generator 500 may apply an erase verification voltage to the entire word-lines of the memory block and/or sequentially apply the erase verification voltage to word-lines in a word-line basis.

In some example embodiments, during the program operation, the voltage generator 500 may apply a program voltage to the selected word-line and may apply a program pass voltage to the unselected word-lines. In addition, during the program verification operation, the voltage generator 500 may apply a program verification voltage to the selected word-line and may apply a verification pass voltage to the unselected word-lines.

The page buffer circuit 410 may be coupled to the memory cell array 200 through the plurality of bit-lines BLs. The page buffer circuit 410 may include a plurality of page buffers. The page buffer circuit 410 may temporarily store data to be programmed in a selected page and/or data read out from the selected page.

The data I/O circuit 420 may be coupled to the page buffer circuit 410. During the program operation, the data I/O circuit 420 may receive program data DATA from the memory controller 50 and provide the program data DATA to the page buffer circuit 410 based on the column address C_ADDR received from the control circuit 450. During the read operation, the data I/O circuit 420 may provide read data DATA, which are stored in the page buffer circuit 410, to the memory controller 50 based on the column address C_ADDR received from the control circuit 450.

The temperature sensor 430 may sense operating temperature of the nonvolatile memory device 100 and may provide the control circuit 450 with a temperature signal TS corresponding to the operating temperature. For example, the temperature sensor 430 may include at least one of a thermocouple, thermistor, an integrated circuit sensor, and/or the like.

Figure 4:
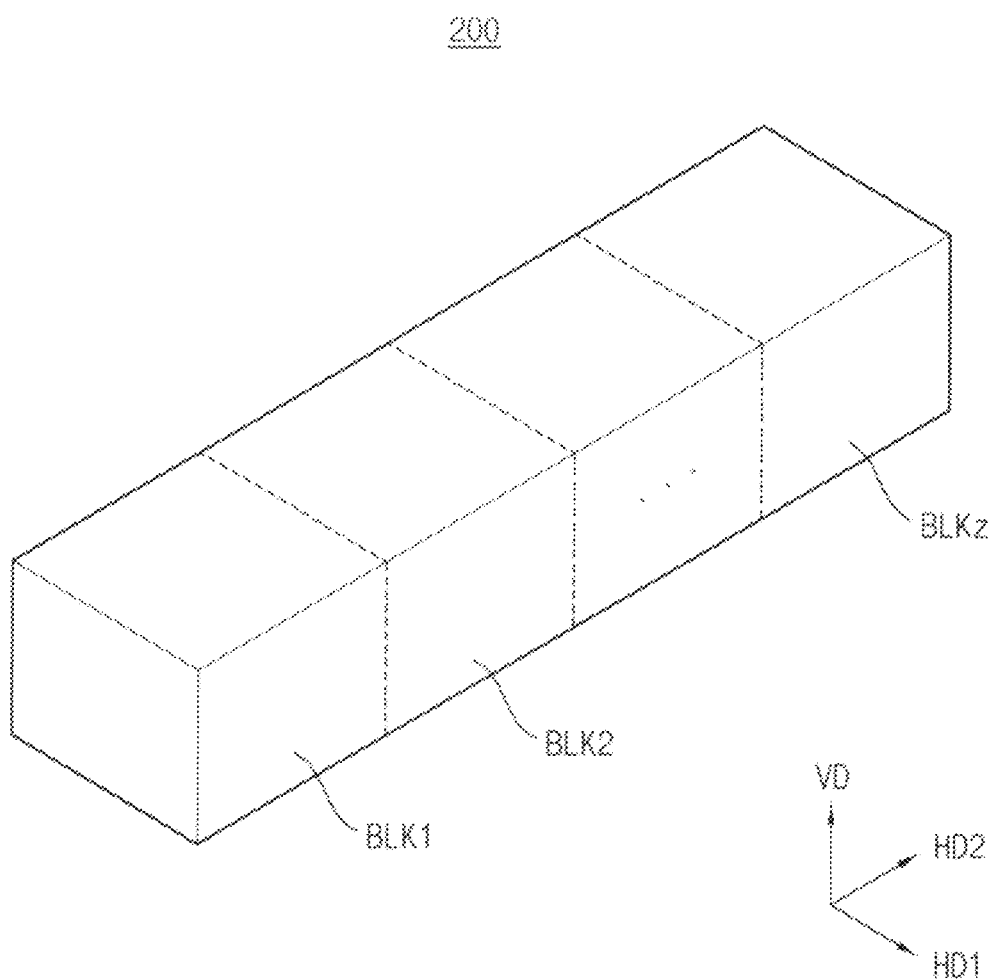
FIG. 4 is a block diagram illustrating an example of the memory cell array in FIG. 3 according to some example embodiments.

FIG. 4 is a block diagram illustrating an example of the memory cell array in FIG. 3 according to some example embodiments.

Referring to FIG. 4, the memory cell array 200 may include a plurality of memory blocks BLK1 to BLKz (z is an integer greater than two) which extend along a first horizontal direction HD1. In an embodiment, the memory blocks BLK1 to BLKz are selected by the address decoder 300 in FIG. 3. For example, the address decoder 300 may select a memory block BLK corresponding to a block address among the memory blocks BLK1 to BLKz.

Hereinafter, a second horizontal direction HD2 indicates a direction perpendicular to the first horizontal direction HD1 and the vertical direction VD indicates a direction perpendicular to the first horizontal direction HD1 and the second horizontal direction HD2 and/or a direction perpendicular to a substrate.

Figure 5:
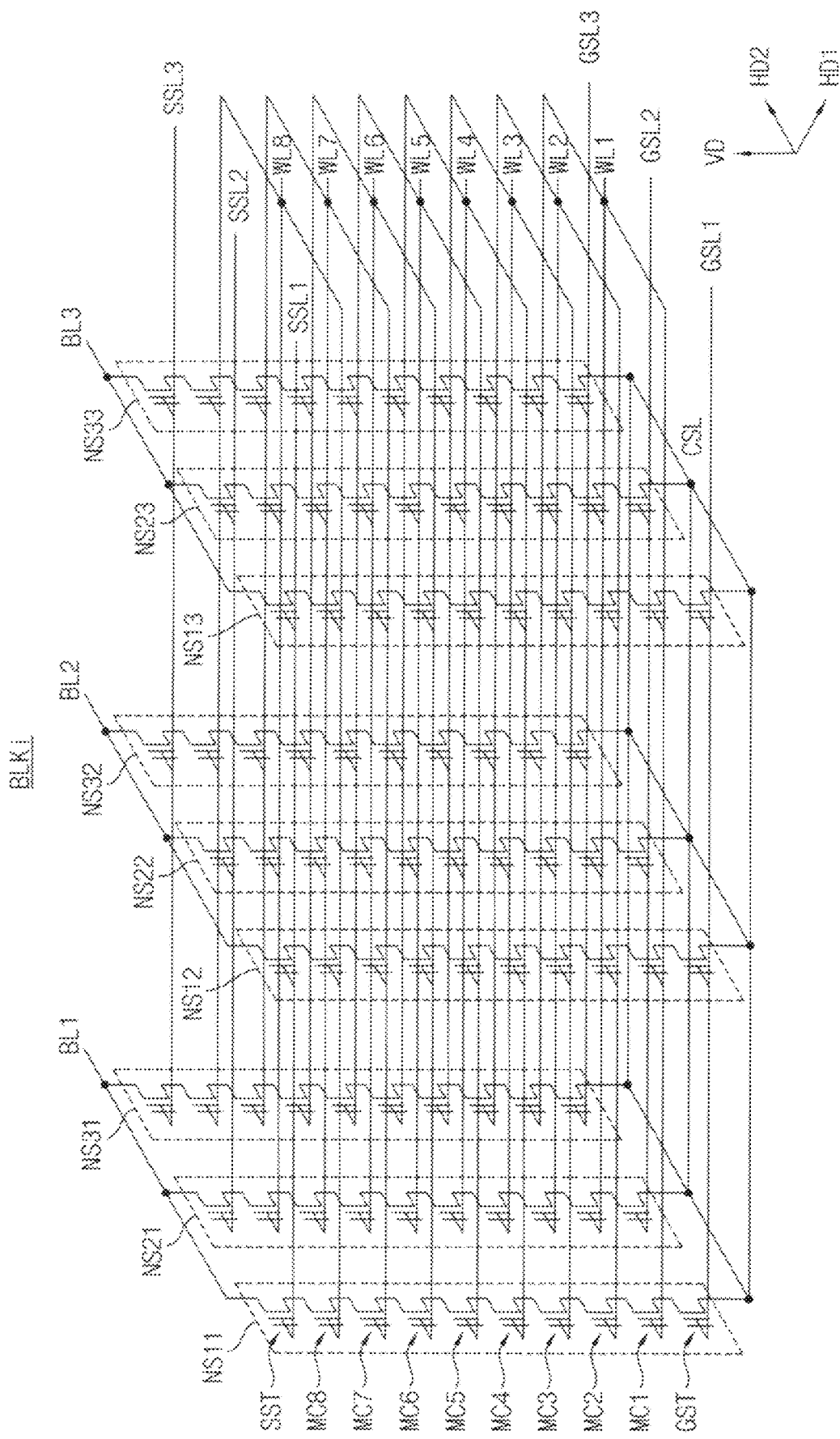
FIG. 5 is a circuit diagram illustrating one of the memory blocks in FIG. 4 according to some example embodiments.

FIG. 5 is a circuit diagram illustrating one of the memory blocks in FIG. 4 according to some example embodiments.

The memory block BLKi of FIG. 5 may be formed on a substrate in a three-dimensional structure (and/or a vertical structure). For example, a plurality of memory cell strings included in the memory block BLKi may be formed in a direction perpendicular to the substrate.

Referring to FIG. 5, the memory block BLKi may include a plurality of memory cell strings (e.g., NS11 to NS33) coupled between a plurality of bit-lines (e.g., BL1, BL2, and BL3) and a common source line CSL.

Each of the memory cell strings (e.g., NS11 to NS33) may include a string selection transistor SST, a plurality of memory cells (e.g., MC1 to MC8), and a ground selection transistor GST. The string selection transistor SST may be connected to corresponding string selection lines SSL1 to SSL3.

The plurality of memory cells (e.g., MC1 to MC8) may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2, and BL3, and the ground selection transistor GST may be connected to the common source line CSL. Word-lines (e.g., WL1) having the same height may be commonly connected, and the ground selection lines (e.g., GSL1 to GSL3) and the string selection lines (e.g., SSL1 to SSL3) may be separated. Though FIG. 5. is illustrated as including, e.g., eight memory cells MC1 to MC8, three ground selection lines GSL1 to GSL3, three bit-lines BL1 to BL3, and nine memory cell strings NS11 to NS33, the example embodiments are not limited thereto, and may, for example, include more or fewer of each.

The size or the critical dimension (CD) of a channel hole three-dimensional NAND flash memory device may be relatively small and therefore more vulnerable to a program disturbance when compared to, e.g., two-dimensional NAND flash memory devices. For example, in the case of a multiple level cell (MLC), the bit number programmed in each cell is increased. However, as the number of the program loops is increased due to the increased number of the programmed states the performance degradation due to the program disturbance is also increased. Accordingly the program operation may be performed along the direction of a size decrease of the channel hole as will be described below. When the program operation is performed along the direction of the size decrease of the channel hole, a bias voltage may be applied to a ground selection line and an unselect string initial precharge (USIP) may be performed using a voltage of a common source line.

The USIP may be performed by using a gate induced drain leakage (GIDL). As understood from the name, GIDL indicates a phenomenon that a leakage occurs at a drain of a transistor by a gate of the transistor. For example, when 0 V or a negative voltage level is applied to the gate and a sufficiently high positive voltage is applied to the drain, severe band bending may be induced in the oxide near the drain and thus band-to-band tunneling from the valence band of the silicon surface to the conduction band of the silicon body may occur.

The tunneling electrons are attracted to the drain and the drain current increases. Usually the semiconductor substrate is biased by a ground voltage, and holes are attracted to the semiconductor substrate of a relatively low voltage. The gate voltage of a negative voltage level is used to turn off the transistor, but the transistor operates as if it is turned on because the drain current of the GIDL current increases due to the GIDL phenomenon. The GIDL current increases as the gate voltage is decreased and/or the drain voltage is increased.

The channels of each of the cell strings may be precharged by using the GIDL. For generating the GIDL phenomenon, a string selection transistor of a cell string, a ground selection transistor of a cell string, and/or a GIDL transistor may be used.

Figure 6A:
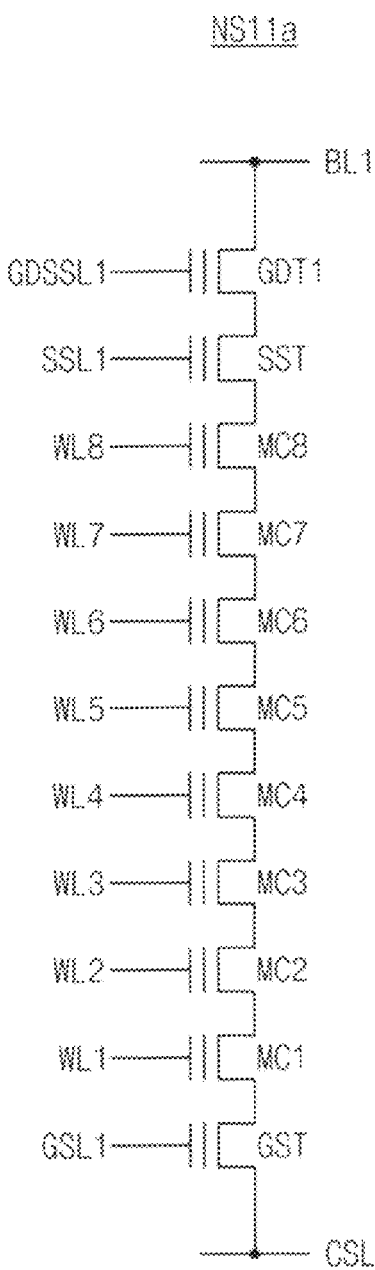
FIGS. 6A through 6C illustrate examples of one of cell strings in FIG. 5, respectively, according to some example embodiments.
Figure 6B:
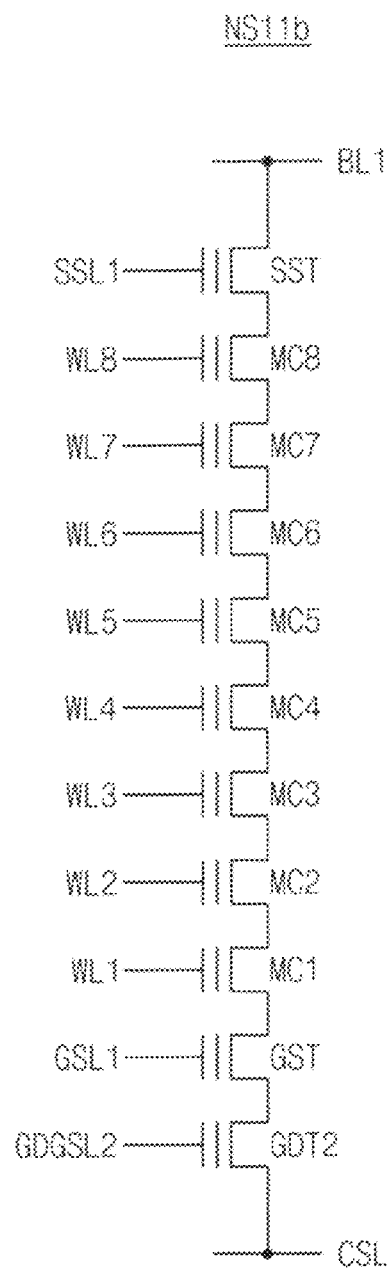
Figure 6C:
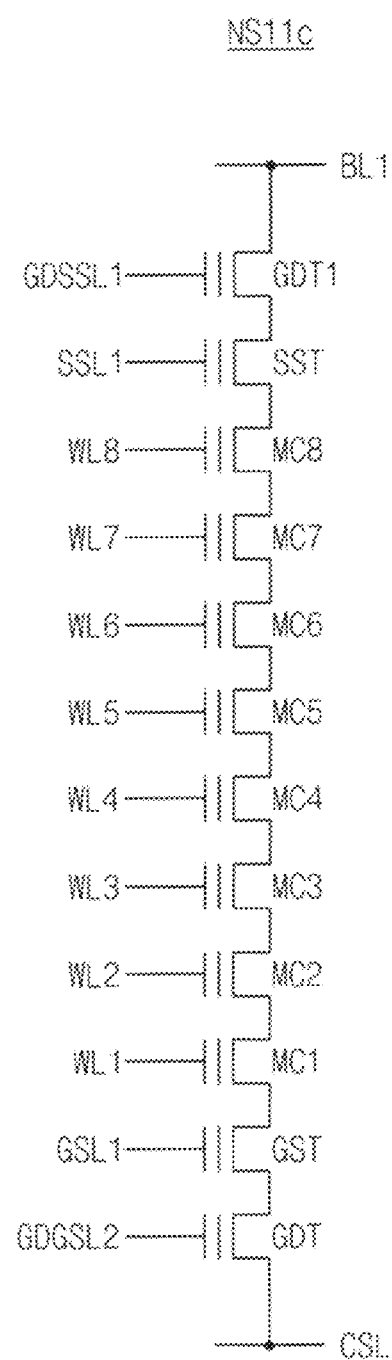

FIGS. 6A through 6C illustrate examples of one of cell strings in FIG. 5, respectively, according to some example embodiments.

Referring to FIG. 6A, a cell string NS11a may include a ground selection transistor GST, a plurality of memory cells (e.g., MC1 to MC8), a string selection transistor SST, and a GIDL string selection transistor GDT1 connected in series between the common source line CSL and a bit-line (e.g., the bit-line BL1).

The GIDL string selection transistor GDT1 may be coupled to a GIDL string selection line GDSSL1. In this case, a uni-directional channel precharge may be performed in each of the cell strings during the bit-line set-up period PBLS, by applying a GIDL drain voltage to all or some of the plurality of bit-lines such that the applied GIDL drain voltage has a voltage level higher than a voltage difference between a GIDL threshold voltage and a GIDL on voltage. Herein, the GIDL on voltage corresponds to a voltage having a level to turn-on the GIDL string selection transistor GDT1. Each of the memory cell strings NS11 to NS33 in FIG. 5 may employ the cell string NS11a of FIG. 6A.

Referring to FIG. 6B, a cell string NS11b may include a GIDL ground selection transistor GDT2, a ground selection transistor GST, a plurality of memory cells (e.g., MC1 to MC8), and a string selection transistor SST connected in series between the common source line CSL and the bit-line BL1. The GIDL ground selection transistor GDT2 may be coupled to a GIDL ground selection line GDGSL2. In this case, a uni-directional channel precharge may be performed in each of the cell strings, by applying a GIDL drain voltage to the common source line CSL. Each of the memory cell strings NS11 to NS33 in FIG. 6A may employ the cell string NS11b of FIG. 6B.

Referring to FIG. 6C, a cell string NS11c may include a GIDL ground selection transistor GDT2, a ground selection transistor GST, a plurality of memory cells (e.g., MC1 to MC8), a string selection transistor SST and a GIDL string selection transistor GDT1 connected in series between the common source line CSL and the bit-line BL1. The GIDL ground selection transistor GDT2 may be coupled to a GIDL ground selection line GDGSL2 and the GIDL string selection transistor GDT1 may be coupled to a GIDL string selection line GDSSL1. In this case, a bi-directional channel precharge may be performed in each of the cell strings, by applying the GIDL drain voltage to at least a portion of the plurality of bit-lines and applying the GIDL drain voltage to common the source line CSL. Each of the memory cell strings NS11 to NS33 in FIG. 5 may employ the cell string NS11c of FIG. 6C.

Figure 7A:
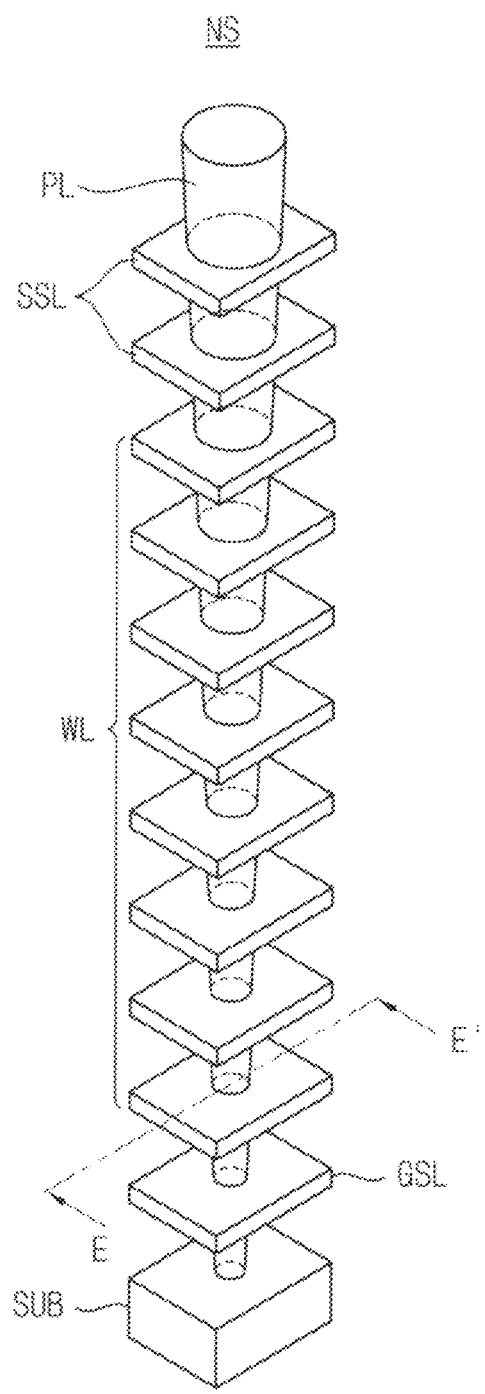
FIG. 7A is a diagram illustrating an example structure of a cell string.
Figure 7B:
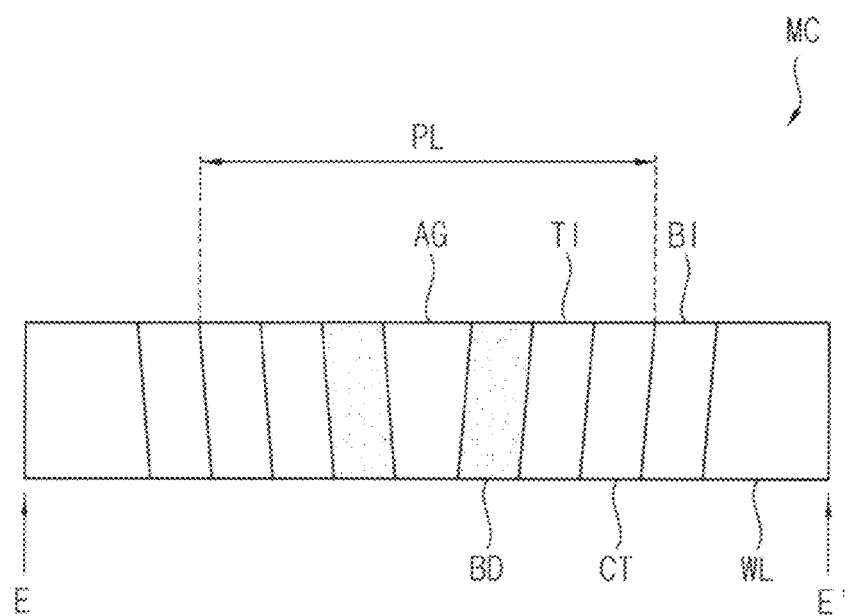
FIG. 7B is a diagram illustrating a memory cell included in the cell string of FIG. 7A.

FIG. 7A is a diagram illustrating an example structure of a cell string, and FIG. 7B is a diagram illustrating a memory cell included in the cell string of FIG. 7A.

Referring to FIGS. 7A and 7B, a pillar PL extending in a vertical direction may be formed on a substrates SUB for providing the cell string NS. The ground selection line GSL, the word-lines WL, and the string selection lines SSL may be formed of conductive materials (such as metals) which are parallel to the substrate SUB. The pillar PL may penetrate the conductive materials forming the ground selection line GSL, the word-lines WL, and the string selection lines SSL to contact the substrate SUB. In some example embodiments, the word-lines WL may include dummy word-lines.

FIG. 7B illustrates a cross-sectional view cut along the line E-E' in FIG. 7A. As an example, a cross-section of one memory cell MC corresponding to a word-line is illustrated in FIG. 7B. The pillar PL may include a body BD in a form of a cylinder, and an airgap AG may be provided in the body BD. The body BD may include, e.g., a semiconductor such as silicon, germanium, gallium-arsenide, gallium-nitride, and/or the like, and the body BD may be a region in which a channel if formed. In some example embodiments, the body BD may have (and/or doped to have) a charge type (e.g., p- and/or n-type). For example, in some example embodiments, the body BD may include silicon doped with at least one of boron (B) and/or indium (In) to be a p-type semiconductor.

The pillar PL may further include a tunnel insulation layer TI surrounding the body BD and a charge capturing layer CT surrounding the tunnel insulation layer T1. A blocking insulation layer BI may be provided between one word-line and the pillar PL. The tunnel insulation layer TI and/or the blocking insulation layer BI may include, for example, an insulating material such as silicon oxide, silicon nitride, and/or the like. The charge capturing layer CT may, in some example embodiments, include a conductive material. The body BD, the tunnel insulation layer TI, the charge capturing layer CT, the blocking insulation layer BI, and the one word-line may form a transistor of a charge capturing type.

In some example embodiments, the string selection transistor SST, the ground selection transistor GST, and the other memory cells may have the same (and/or a substantially similar) structure as illustrated in FIG. 7B.

As illustrated in FIGS. 7A and 7B, the width or the cross-section area of the pillar PL may be decreased as the distance to the substrate SUB is decreased.

When the same voltage is applied to the bodies of the ground selection transistor GST, the memory cells MC, and the string selection transistor SST, and the same voltage is applied to the ground selection line GLS, the word-lines WL, and the string selection line SSL, the electric field formed in the memory cell located near the substrate SUB is greater than the electric field formed in the memory cell located far from the substrate SUB. These characteristics may affect the program disturbance during the program operation.

Figure 8:
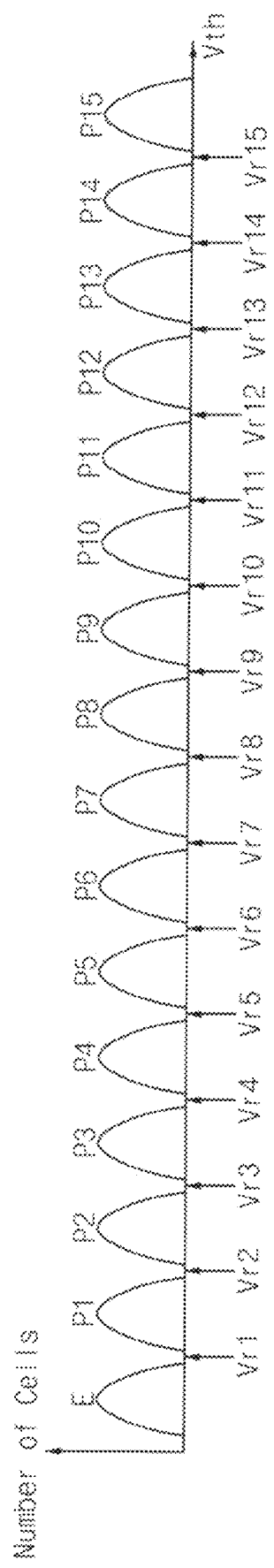
FIG. 8 is a graph showing a threshold voltage distribution of memory cells when a memory cell included in the memory cell array in FIG. 3 is a 4-bit quadrature level cell.

FIG. 8 is a graph showing a threshold voltage distribution of memory cells when a memory cell included in the memory cell array in FIG. 3 is a 4-bit quadrature level cell (QLC).

Referring to FIG. 8, a horizontal axis represents a threshold voltage Vth and the vertical axis represents the number of memory cells. When each of the memory cells is a 4-bit quadrature level cell programmed to store 4 bits, the memory cell may have one from among an erase state E and first through fifteenth program states P1 through P15. When a memory cell is a multi-level cell, unlike a single-level cell, since an interval between threshold voltages distributions is small, a small change in the threshold voltage Vth may cause a big problem.

A first read voltage Vr1 has a voltage level between a distribution of a memory cell having the erase state E and a distribution of a memory cell having the first program state P1. Each of second through fifteenth read voltages Vr2 through Vr15 have a voltage level between distributions of memory cells having adjacent program states.

In some example embodiments, assuming that the first read voltage Vr1 is applied, when a memory cell is turned on, data '1' may be stored, and when the memory cell is turned off, data '0' may be stored. However, the present disclosures are not limited thereto, and other example embodiments, assuming that the first read voltage Vr1 is applied, when a memory cell is turned on, data '0' may be stored, and when the memory cell is turned off, data '1' may be stored. As such, a logic level of data may vary according to the present disclosures.

FIG. 9A is a block diagram illustrating the control circuit in the nonvolatile memory device of FIG. 3 according to some example embodiments.

Referring to FIG. 9A, the control circuit 450 may include a command decoder 460, an address buffer 470, a program/erase (P/E) cycle counter 470, a read cycle counter 475, a temperature code generator 480, and a control signal generator 490.

The command decoder 460 may decode the command CMD and provide a decoded command D_CMD to the program/erase cycle counter 470, the read cycle counter 475, and the control signal generator 480. The command decoder 460 may provide the decoded command D_CMD to the program/erase cycle counter 470 in response to the decoded command D_CMD corresponding to a program command and/or an erase command. The command decoder 460 may provide the decoded command D_CMD to the read cycle counter 475 in response to the decoded command D_CMD corresponding to a read command The address buffer 470 may receive the address signal ADDR, provide the row address R_ADDR to the address decoder 430, the program/erase cycle counter 470 and the read cycle counter 475 and provide the column address C_ADDR to the data I/O circuit 420.

The program/erase cycle counter 470 may count a program/erase counting value of each word-line based on the row address R_ADDR and the decoded command D_CMD and may provide a first counting value CV1 to the control signal generator 490.

The read cycle counter 475 may count a read counting value of each word-line based on the row address R_ADDR and the decoded command D_CMD and may provide a second counting value CV2 to the control signal generator 490.

The temperature code generator 480 may receive the temperature signal TS, may convert the temperature signal TS to a temperature code TCD and may provide the temperature code TCD to the control signal generator 490.

The control signal generator 480 may receive the decoded command D_CMD, the first counting value CV1 and the second counting value CV2, may generate the control signals CTLs based on an operation directed by the decoded command D_CMD and condition denoted by the first counting value CV1 and the second counting value CV2 to provide the control signals CTLs to the voltage generator 500, may generate the page buffer control signal PCTL to provide the page buffer control signal PCTL to the page buffer circuit 410, and may generate the switching control signals SCS to provide the switching control signals SCS to the address decoder 300.

Figure 9B:
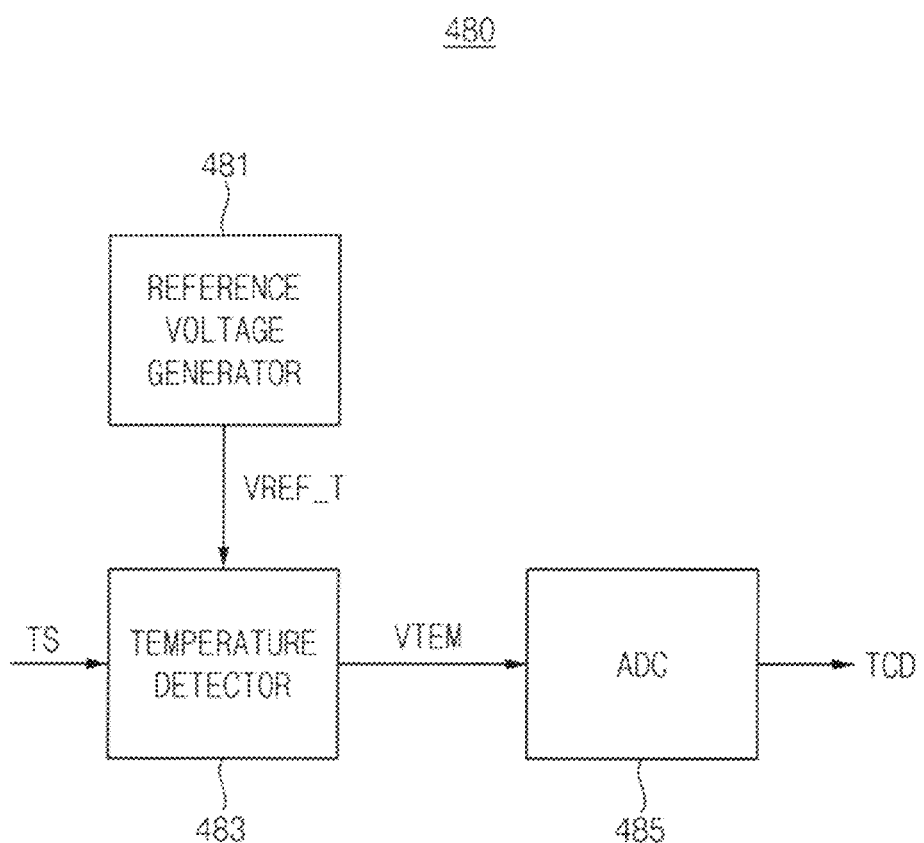
FIG. 9B is a block diagram illustrating an example of the temperature code generator in FIG. 9A according to some example embodiments.

FIG. 9B is a block diagram illustrating an example of the temperature code generator in FIG. 9A according to example embodiments.

Referring to FIG. 9B, the temperature code generator 480 may include a reference voltage generator 481, a temperature detector 483 and an analog-to digital converter (ADC) 485.

The reference voltage generator 481 may generate a reference voltage VREF_T stably/constantly, e.g., regardless of a temperature variation.

The temperature detector 483 may generate a temperature voltage VTEM based on comparing the reference voltage VREF_T and the temperature signal TS associated with memory cells to be driven. The temperature voltage VTEM may be inversely proportional to the operating temperature.

The ADC 485 may convert the temperature voltage VTEM into the temperature code TCD.

Figure 9C:
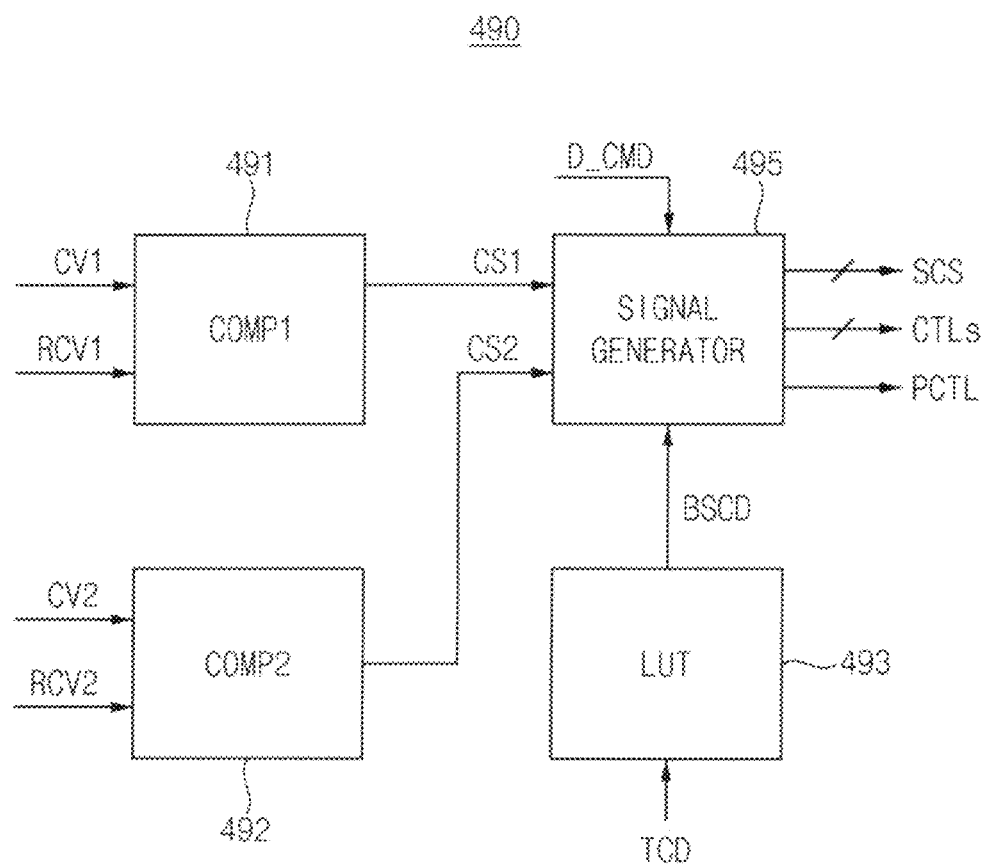
FIG. 9C is a block diagram illustrating an example of the control signal generator in the control circuit of FIG. 9A according to some example embodiments.

FIG. 9C is a block diagram illustrating an example of the control signal generator in the control circuit of FIG. 9A according to some example embodiments.

Referring to FIG. 9C, the control signal generator 490 may include a first comparator COMP1 491, a second comparator COMP2, a look-up table (LUT) 493, and a signal generator 495.

The first comparator 491 may compare the first counting value CV1 with a first reference value RCV1 to output a first comparison signal CS1 based on the comparison. The first comparison signal CS1 may indicate whether a program/erase counting value of a memory cell row (a target page) to be accessed is greater than the first reference value RCV1.

The second comparator 492 may compare the second counting value CV2 with a second reference value RCV2 to output a second comparison signal CS2 based on the comparison. The second comparison signal CS2 may indicate whether a read counting value of a memory cell row (a target page) to be accessed is greater than the second reference value RCV2.

The LUT 493 may store variance information of threshold voltages of memory cells and bias code representing the variance information in each of a plurality of ranges of the temperature code TCD. The LUT 493 may receive the temperature code TCD and may output the bias code BSCD of a corresponding range of the temperature code TCD to the signal generator 495. For example, the plurality of ranges of the temperature code TCD may include, e.g., a first range, a second range, and a third range. When the temperature code TCD belongs to the first range, the LUT 493 outputs the bias code BSCD representing the variance information of the threshold voltages of memory cells associated with the first range. When the temperature code TCD belongs to the second range, the LUT 493 outputs the bias code BSCD representing the variance information of the threshold voltages of memory cells associated with the second range. When the temperature code TCD belongs to the third range, the LUT 493 outputs the bias code BSCD representing the variance information of the threshold voltages of memory cells associated with the third range.

The signal generator 495 may receive the decoded command D_CMD, the first comparison signal CS1, the second comparison signal CS2, and the bias code BSCD. The signal generator 495 may generate the switching control signals SCS and the page buffer control signal PCTL based on the operation designated by the decoded command D_CMD. In addition, the signal generator 495 may generate the control signals CTLs to control the voltage generator 500 based on the decoded command D_CMD, the first comparison signal CS1 and the second comparison signal CS2.

When the decoded command D_CMD corresponds to the program command, the signal generator 495 may generate the control signals CTLs including information to control a level of a high voltage applied to a gate of a pass transistor coupled to a selected word-line based on the first comparison signal CS1.

When the decoded command D_CMD corresponds to the erase command, the signal generator 495 may generate the control signals CTLs including information to control a level of a high voltage applied to each gate of pass transistors coupled to a bit-line and a common source line based on the first comparison signal CS1.

When the decoded command D_CMD corresponds to the read command, the signal generator 495 may generate the control signals CTLs including information to control a level of a high voltage applied to each gate of pass transistors coupled to unselected word-lines based on the second comparison signal CS2.

Figure 10:
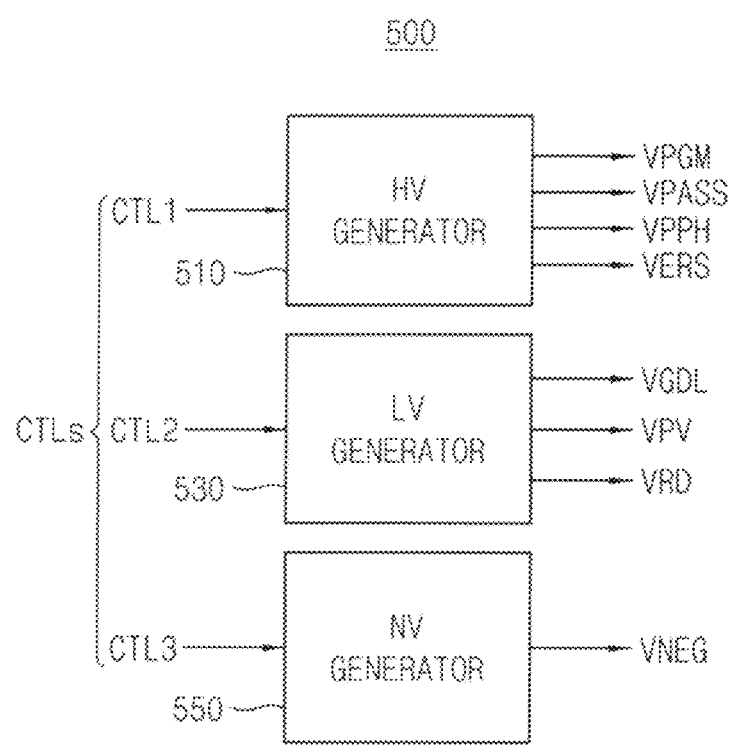
FIG. 10 is a block diagram illustrating the voltage generator in the nonvolatile memory device of FIG. 3 according to some example embodiments.

FIG. 10 is a block diagram illustrating the voltage generator in the nonvolatile memory device of FIG. 3 according to some example embodiments.

Referring to FIG. 10, the voltage generator 500 may include a high voltage ("HV") generator 510 and a low voltage ("LV") generator 530. The voltage generator 500 may further include a negative voltage ("NV") generator 550.

The high voltage generator 510 may generate a program voltage VPGM, a pass voltage VPASS, a high voltage VPPH, and an erase voltage VERS according to operations directed by the command CMD, in response to a first control signal CTL1.

The program voltage VPGM is applied to the selected word-line, the pass voltage VPASS may be applied to the unselected word-lines, and the erase voltage VERS may be applied to the well of the memory block (or each drain of pass transistors coupled to a bit-line) and a common source line. The high voltage VPPH may be applied to each gate of pass transistors coupled to word-lines, a string selection line and a ground selection line. The first control signal CTL1 may include a plurality of bits which indicate the operations directed by the decoded command D_CMD.

The low voltage generator 530 may generate a program verification voltage VPV, a read voltage VRD, and/or an erase control voltage VGDL according to operations directed by the command CMD, in response to a second control signal CTL2. The program verification voltage VPV and the read voltage VRD may be applied to the selected word-line according to operation of the nonvolatile memory device 200. The erase control voltage VGDL may be applied to a gate of the GIDL transistors in the erase operation. The second control signal CTL2 may include a plurality of bits which indicate the operations directed by the decode command D_CMD.

The negative voltage generator 750 may generate a negative voltage VNEG which has a negative level according to operations directed by the command CMD, in response to a third control signal CTL3. The third control signal CTL3 may include a plurality of bits which indicate the operations directed by the decoded command D_CMD. The negative voltage VNEG may be applied to a selected word-line and unselected word-lines during a program recovery period and may be applied to the unselected word-lines during a bit-line set-up period.

Figure 11:
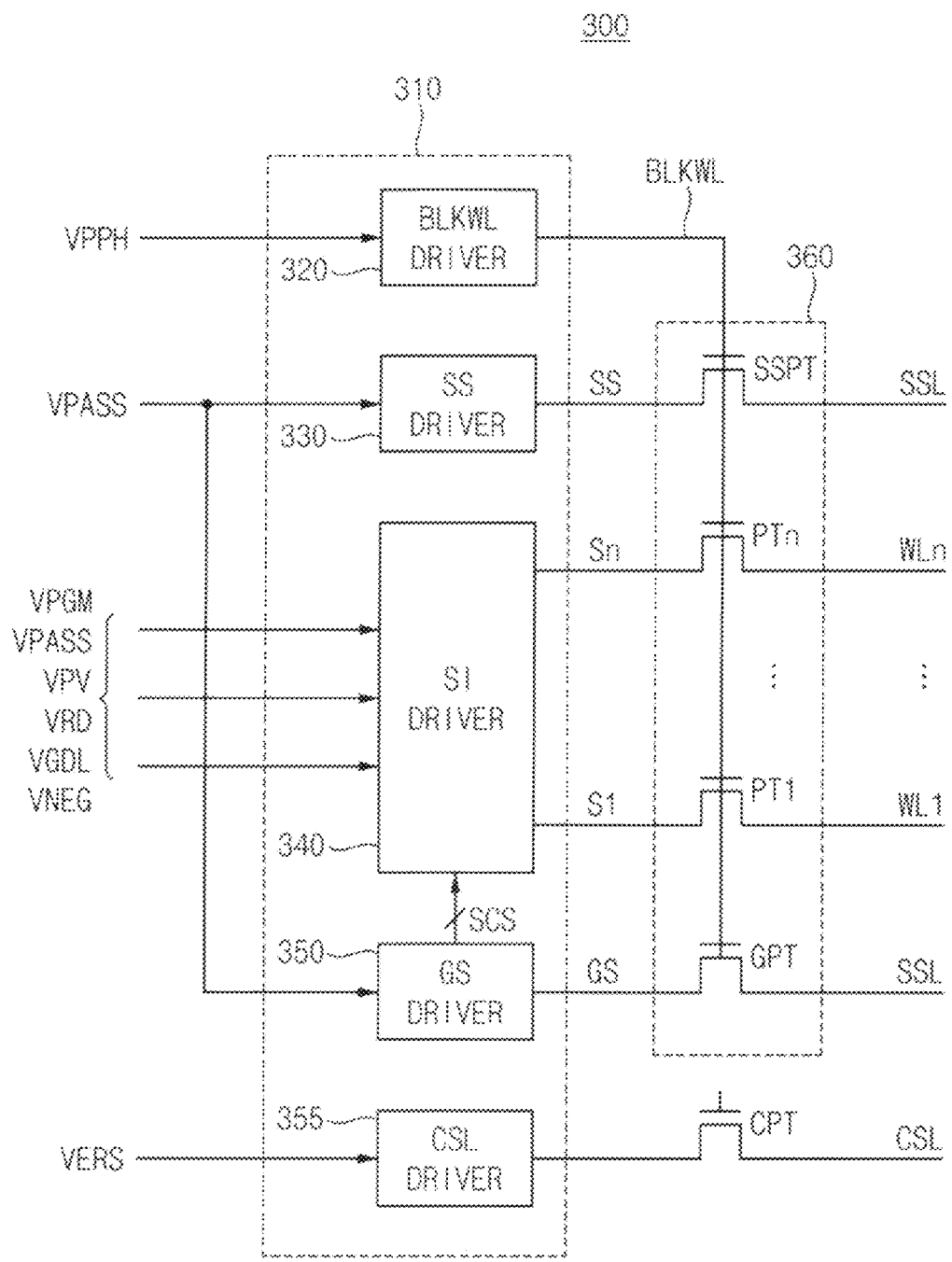
FIG. 11 is a block diagram illustrating an example of the address decoder in the nonvolatile memory device of FIG. 3 according to some example embodiments.

FIG. 11 is a block diagram illustrating an example of the address decoder in the nonvolatile memory device of FIG. 3 according to some example embodiments.

Referring to FIG. 11, the address decoder 300 may include a driver circuit 310, a pass switch circuit 360 and a pass switch CPT.

The driver circuit 310 may transfer voltages provided from the voltage generator 500 to the memory cell array 200 in response to a block address. The driver circuit 310 may include a block selection driver BWLWL DRIVER 320, a string selectin driver SS DRIVER 330, a driving line driver SI DRIVER 340, a ground selection driver GS DRIVER 350 and a common source line (CSL) driver 355.

The block selection driver 320 may supply the high voltage VPPH from the voltage generator 500 to the pass transistor circuit 360 in response to the block address. The block selection driver 320 may supply the high voltage VPPH to a block word-line BLKWL coupled to gates of a plurality of pass transistors (e.g., GPT, PT1~PTn, and SSPT) in the pass transistor circuit 360. Here, n is an integer greater than one. The block selection driver 320 may control the application of various voltages such as a pass voltage, a program voltage, a read voltage to the memory cell array 200.

The string selection driver 330 may supply voltage from the voltage generator 500 to the string selection line SSL through the pass transistor SSPT as a string selection signal SS. During a program operation, the string selection driver 330 may supply the selection signal SS so as to turn on all string selection transistors in a selected memory block.

The driving line driver 340 may supply the program voltage VPGM, the pass voltage VPASS, the verification voltage VPV, the read voltage VRD, the erase control voltage VGDL, and the negative voltage VNEG from the voltage generator 500 to word-lines WL1~WLn through driving lines S1~Sn and the pass transistors PT1~PTn.

The ground selection driver 350 may supply a ground selection signal GS from the voltage generator 500 as the ground selection line GSL through the pass transistor GPT.

The CSL driver 355 may supply the erase voltage VERS from the voltage generator 500 to the common source line CSL through the pass transistor CPT. The high voltage VPPH may be applied to a gate of the pass transistor CPT.

The pass transistors GPT, PT1~PTn and SSPT are configured such that the ground selection line GSL, the word-lines WL1-WLn and the string selection line SSL are electrically connected to corresponding driving lines, in response to activation of the high voltage VPPH on the block word-line BLKWL. In some example embodiments, each of the pass transistors GPT, PT1~PTn, SSPT CPT may include a high voltage transistor (e.g., transistors capable of enduring high-voltage).

Figure 12:
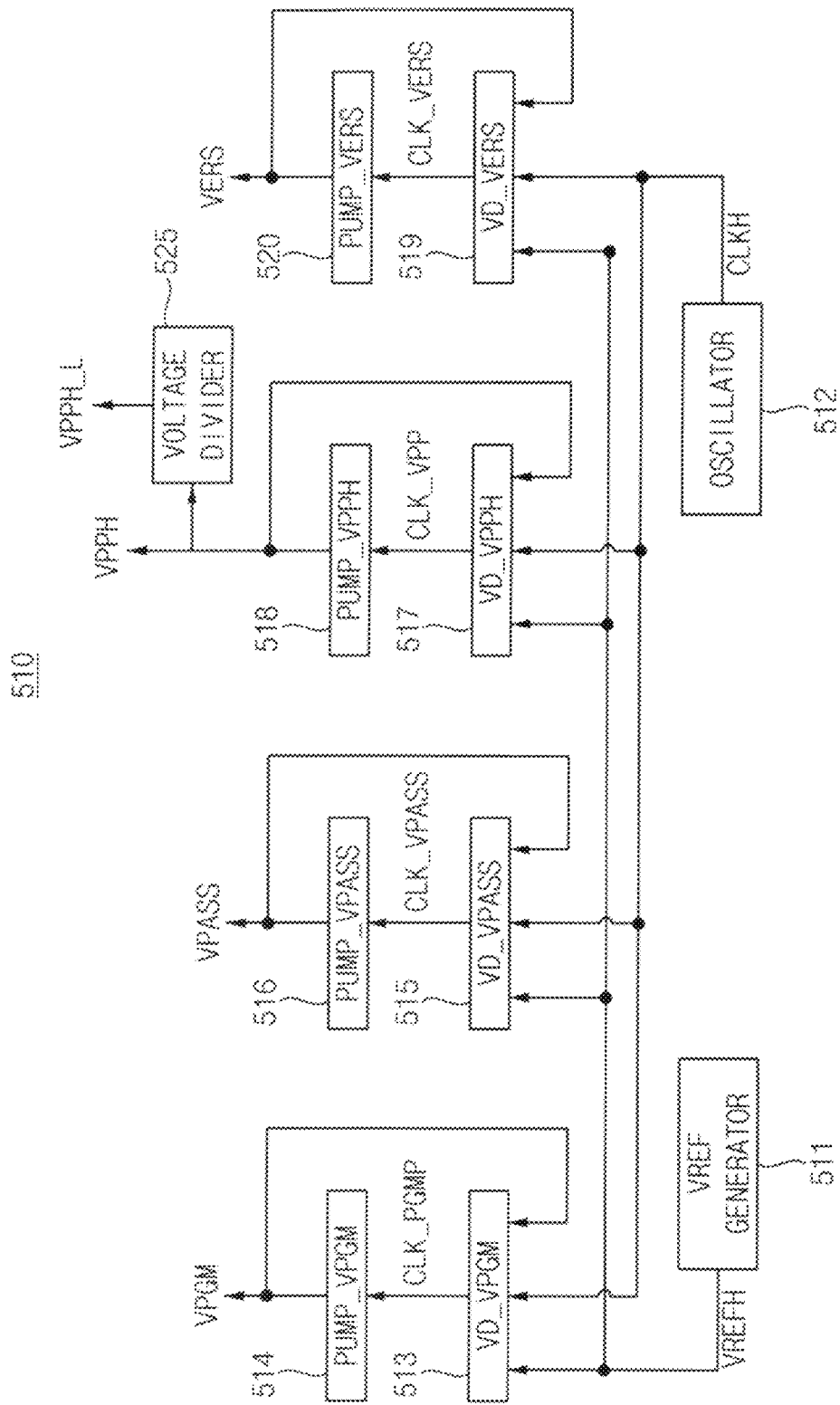
FIG. 12 is a block diagram illustrating an example of the high voltage generator in the voltage generator of FIG. 10 according to some example embodiments.

FIG. 12 is a block diagram illustrating an example of the high voltage generator in the voltage generator of FIG. 10 according to some example embodiments.

Referring to FIG. 12, the high voltage generator 510 may include a reference voltage generator 511, an oscillator 512, a program voltage detector VD_VPGM 513, a program voltage pump PUMP_VPGM 513, a pass voltage detector VD_VPASS 515, a pass voltage pump PUMP_VPASS 516, a high voltage detector VD_VPPH 517, a high voltage pump PUMP_VPPH 518, an erase voltage detector VD_VERS 519, an erase voltage pump PUMP_VERS 520 and a voltage divider 525.

The reference voltage generator 511 may generate a reference voltage VREFH. The oscillator 512 may generate a clock signal CLKH.

The program voltage detector 513 may receive the reference voltage VREFH and the clock signal CLKH, detect the program voltage VPGM and generate a program voltage clock CLK_VPGM. The program voltage pump 514 may generate the program voltage VPGM by operating a boosting circuit based on the program voltage clock CLK_VPGM.

The pass voltage detector 515 may receive the reference voltage VREFH and the clock signal CLKH, detect the pass voltage VPASS, and generate a pass voltage clock CLK_VPASS. The pass voltage pump 516 may generate the pass voltage VPASS by operating a boosting circuit based on the pass voltage clock CLK_VPASS.

The high voltage detector 517 may receive the reference voltage VREFH and the clock signal CLKH, detect the high voltage VPPH and generate a high voltage clock CLK_VPPH. The high voltage pump 518 may generate the high voltage VPPH by operating a boosting circuit based on the high voltage clock CLK_VPPH. The voltage divider 525 may divide the high voltage VPPH to generate a high voltage VPPH_L whose level is smaller than a level of the high voltage VPPH.

The erase voltage detector 519 may receive the reference voltage VREFH and the clock signal CLKH, detect the erase voltage VERS, and generate an erase voltage clock CLK_VERS. The erase voltage pump 520 may generate the erase voltage VERS by operating a boosting circuit based on the erase voltage clock CLK_VERS.

Figure 13:
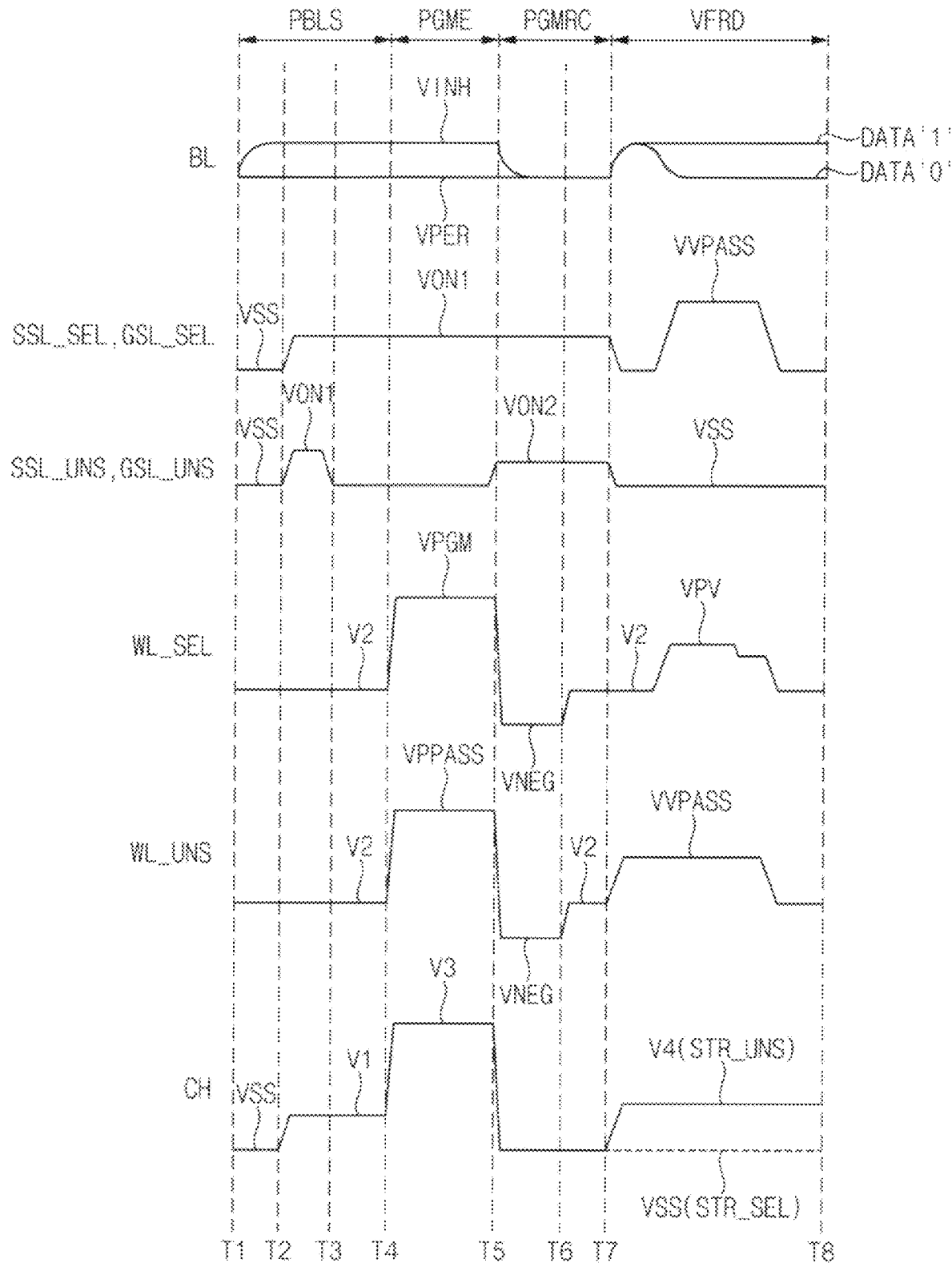
FIG. 13 is a timing diagram illustrating a method of programming in a nonvolatile memory device according to some example embodiments.

FIG. 13 is a timing diagram illustrating a method of programming in a nonvolatile memory device according to some example embodiments.

FIG. 13 illustrates a bit-line set-up period PBLS, a program execution period PGME, a program recovery period PGMRC, and a verification read period VFRD of one of a plurality of program loops. Time points T1~T8 represents boundaries of the periods.

Referring to FIG. 13, during the bit-line set-up period PBLS, a ground voltage VSS is applied to a string selection line SSL_SEL and a ground selection line GSL_SEL of a selected cell string from the time point T1 to the time point T2, and a first turn-on voltage VON1 is applied to the string selection line SSL_SEL and the ground selection line GSL_SEL of the selected string from the time point T2 to the time point T4. The ground voltage VSS is applied to a string selection line SSL_UNS and a ground selection line GSL_UNS of an unselected cell string from the time point T1 to the time point T2, the first turn-on voltage VON1 is applied to the string selection line SSL_UNS and the ground selection line GSL_UNS of the unselected cell string from the time point T2 to the time point T3 and the ground voltage VSS is applied to the string selection line SSL_UNS and the ground selection line GSL_UNS of the unselected cell string from the time point T3 to the time point T4. In some example embodiments, levels of voltages applied to the string selection line SSL_UNS and the ground selection line GSL_UNS of the unselected cell string may be varied according to a position of the unselected cell string.

A second voltage V2 greater than the ground voltage VSS is applied to a selected word-line WL_SEL and an unselected word-line WL_ULS from the time point T1 to the time point T4. Accordingly, a channel of each of the cell strings is precharged from the ground voltage VSS to the first voltage V1. For example, a channel of each of the cell strings may be precharged to the first voltage V1 by performing an unselect string initial precharge (USIP).

A program inhibit voltage VINH and/or a program permission voltage VPER is applied to a bit-line BL based on a value of write data at a starting point T1 of the bit-line set-up period PBLS.

During the program execution period PGME between the time point T4 and the time point T5, successive to the bit-line set-up period PBLS, the first turn-on voltage VON1 is applied to string selection line SSL_SEL and the ground selection line GSL_SEL of the selected string, a program voltage VPGM is applied to the selected word-line WL_SEL and a program pass voltage VPPASS is applied to the unselected word-line WL_UNS. Accordingly, voltage level of the channel CH of each of the cell strings is increased to a third voltage V3. During the program execution period PGME, the level of the bit-line BL is maintained at the program inhibit voltage VINH or the program permission voltage VPER based on the value of the write data.

During the program recovery period PGMRC between the time point T5 and the time point T7, successive to the program execution period PGME, the first turn-on voltage VON1 is applied to the string selection line SSL_SEL and the ground selection line GSL_SEL of the selected string, a second turn-on voltage VON2 smaller than the first turn-on voltage VON1 is applied to the string selection line SSL_UNS and the ground selection line GSL_UNS of the unselected cell string. In addition, after a first negative voltage VNEG1 is applied to the selected word-line WL_SEL and the unselected word-line WL_UNS from the time point T5 and to the time point T6, the second voltage V2 is applied to the selected word-line WL_SEL and the unselected word-line WL_UNS from the time point T6 and to the time point T7.

The selected word-line WL_SEL and the unselected word-line WL_UNS are recovered to the second voltage V2 after elected word-line WL_SEL and the unselected word-line WL_UNS are recovered to the negative voltage VNEG. Since the first turn-on voltage VON1 is applied to the string selection line SSL_SEL and the ground selection line GSL- _SEL of the selected string, and the second turn-on voltage VON2 is applied to string selection line SSL_UNS and the ground selection line GSL_UNS of the unselected cell string, the selected cell string and the unselected cell string are open, and thus the voltage level of the channel CH of each of the cell strings is lowered to a voltage level around the ground voltage VSS, and is maintained. The voltage level of the bit-line BL converges to the program permission voltage VPER during the program recovery period PGMRC.

During the verification read period VFRD between the time point T7 and the time point T8, successive to the recovery period PGMRC, a verification pass voltage VVPASS is applied to string selection line SSL_SEL and the ground selection line GSL_SEL of the selected string, and the ground voltage VSS is applied to the string selection line SSL_UNS and the ground selection line GSL_UNS of the unselected cell string. In addition, a verification read voltage VPV is applied to the selected word-line WL_SEL and the verification pass voltage VVPASS is applied to the unselected word-line WL_UNS. Therefore, a voltage level of the channel of the selected cell string STR_SEL is maintained at a voltage level around the ground voltage VSS, and a voltage level of the channel of the unselected cell string STR_UNS is increased to a fourth voltage V4. The fourth voltage V4 may be smaller than the third voltage V3 and may be greater than the first voltage V1. Therefore, the soft erase which may occur in the unselected cell string STR_UNS and the hot carrier injection which may occur at an edge of the selected cell string STR_SEL may be prevented.

Even though not illustrated in FIG. 13, during a bit-line precharge period before the verification read period VFRD, all of the bit-lines may be initialized by the same bit-line precharge voltage. A voltage of a bit-line is developed to a voltage corresponding to '1' or '0' depending on the threshold voltage state of the selected memory cell during the verification read period VFRD. The data stored in the selected memory cell may be determined by sensing the voltage development of the bit-line.

The program pass voltage VPPASS and the verification pass voltage VVPASS may be included in the pass voltage VPASS in FIG. 10.

Figure 14:
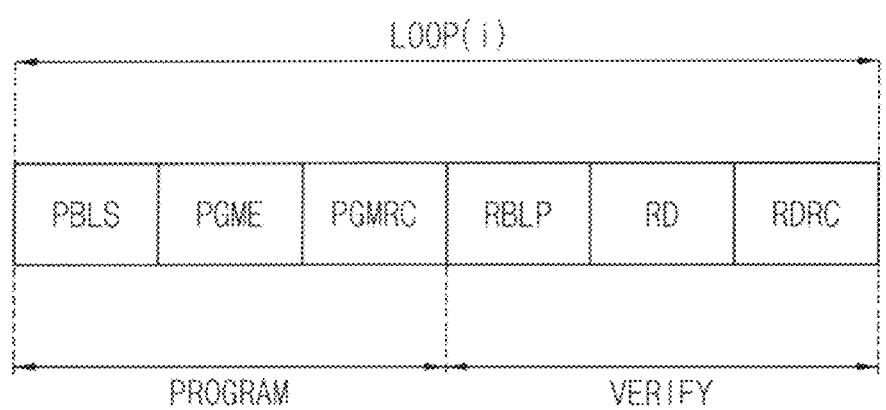
FIG. 14 is a diagram illustrating operation periods included in each of a plurality of program loops for an incremental step pulse programming.

FIG. 14 is a diagram illustrating operation periods included in each of a plurality of program loops for an incremental step pulse programming (ISPP).

Referring to FIG. 14, each program loop(i) may include a program period PROGRAM to apply each of the program voltages to a selected word-line for programming selected memory cells and a verification period VERIFY to apply a verification read voltage to the selected word-line for verifying the success of the program operation.

The program period PROGRAM may include the bit-line set-up period PBLS, a program execution period PGME and a program recovery period PGMRC. The verification period VERIFY may include a bit-line precharge period PBLP, a verification read period VFRD and a read recovery period RDRC. The bit-line set-up period PBLS, the program execution period PGME, the program recovery period PGMRC and the verification read period VFRD are the same as described with reference to FIG. 12.

Figure 15:
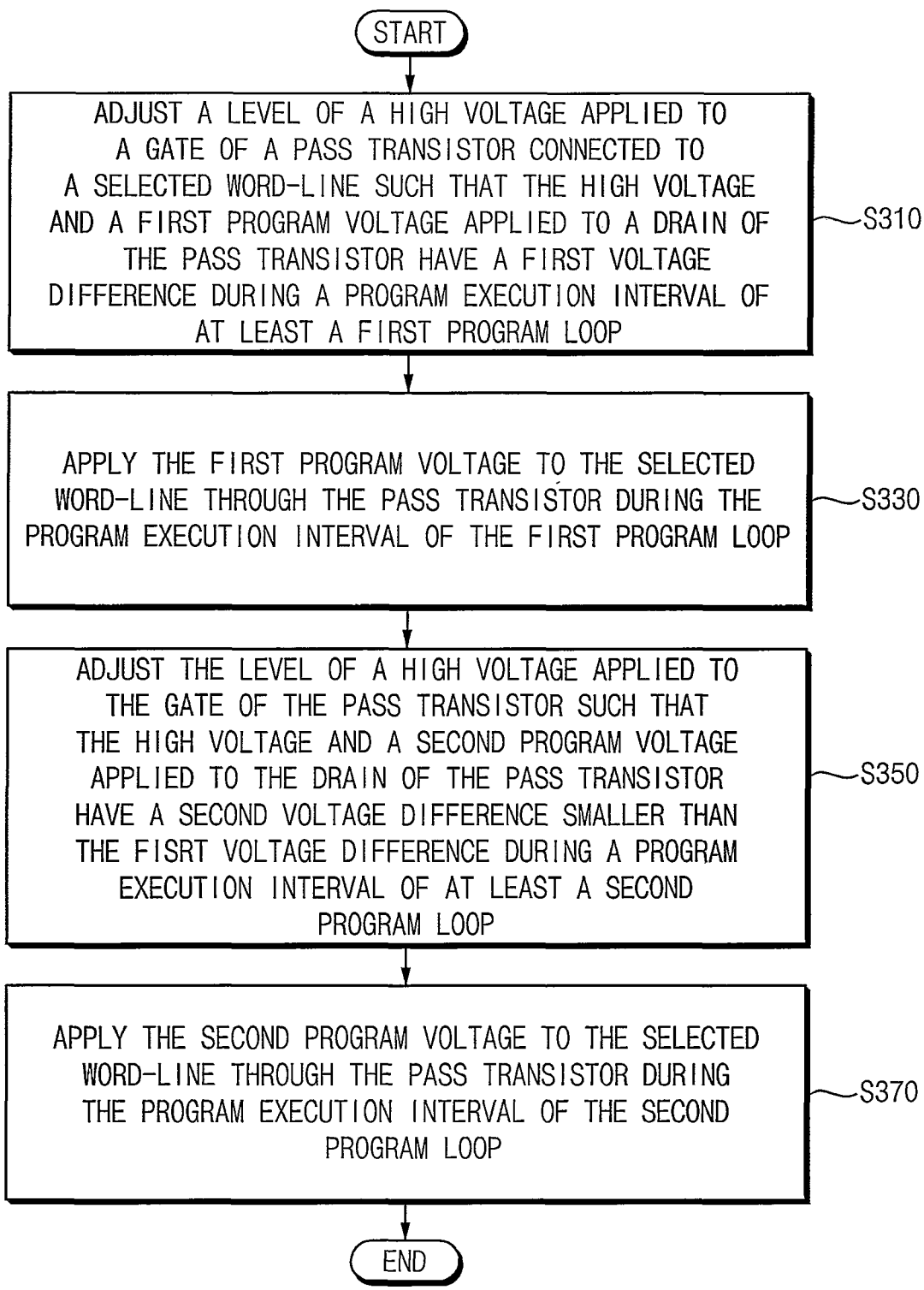
FIG. 15 is a flow chart illustrating a method of programming in a nonvolatile memory device according to some example embodiments.

FIG. 15 is a flow chart illustrating a method of programming in a nonvolatile memory device according to some example embodiments.

For example, provided a method of programming in a nonvolatile memory device which includes at least one memory block including a plurality of cell strings where each of the plurality of cell strings includes a string selection transistor, a plurality of memory cells and a ground selection transistor which are connected in series and disposed in a vertical direction between a bit-line and a common source line and a control circuit 450. The method may be implemented by and/or in, e.g., any of the above example embodiments, and is described in relation to the nonvolatile memory device 100 of FIG. 3.

Referring to FIGS. 3 and 15, the control circuit 450 adjusts a level of a high voltage applied to a gate of a pass transistor of a selected word-line of the plurality of cell strings such that a voltage difference between the high voltage and a program voltage applied to a drain of the pass transistor differs in at least a portion of a plurality of program loops based on a comparison of a number of the program loops and a reference number during a program operation on a target memory cells.

For example, the control circuit 450 may adjust the level of the high voltage such that the high voltage and a first program voltage applied to the drain of the pass transistor have a first voltage difference during a program execution interval of at least a first program loop whose number of the program loops based on the program/erase cycle information is smaller than the reference number (operation S310). The control circuit 450 may apply the first program voltage to the selected word-line through the pass transistor during the program execution interval of the at least one first program loop (operation S330).

The control circuit 450 adjusts the level of the high voltage such that the high voltage and a first program voltage applied to the drain of the pass transistor have a second voltage difference smaller than the first voltage difference during a program execution interval of at least a second program loop whose number of the program loops based on the program/erase cycle information is greater than the reference number (operation S350). The control circuit 450 applies second program voltage to the selected word-line through the pass transistor during the program execution interval of the at least one second program loop (operation S370).

Figure 16:
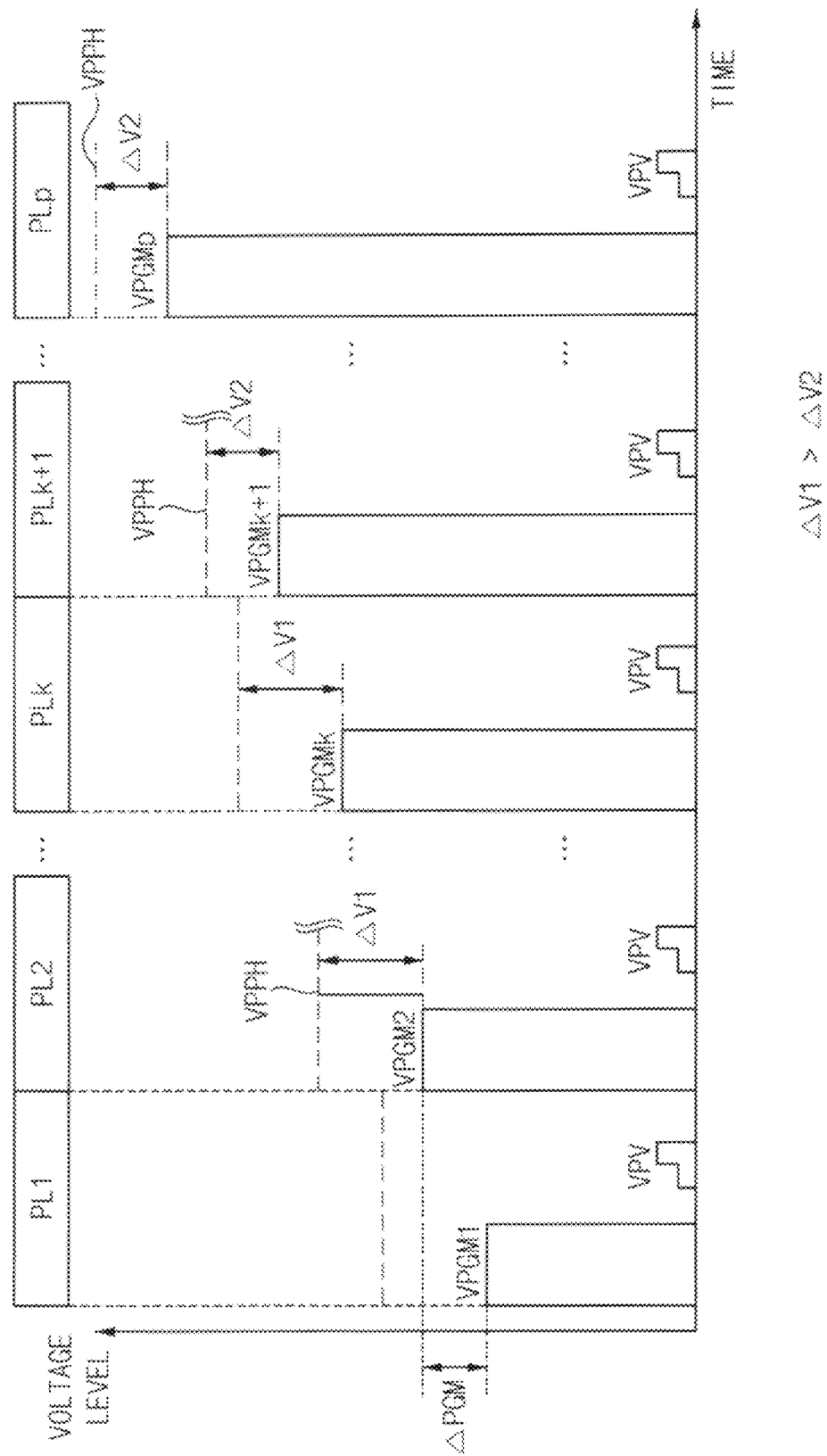
FIG. 16 illustrates a method of programming in a nonvolatile memory device in detail according to some example embodiments.

FIG. 16 illustrates a method of programming in a nonvolatile memory device in detail according to some example embodiments.

In FIG. 16, it is assumed that the at least one first program loop in FIG. 15 includes a plurality of first program loops PL~PLk (k being an integer greater than two) and the at least one second program loop in FIG. 15 includes a plurality of second program loops PLk+1~PLp (p being an integer greater than k), however the example embodiments are not limited thereto.

In FIG. 16, the x-axis may denote time and the y-axis may denote a voltage level.

Referring to FIGS. 3 and 16, the nonvolatile memory device 100 may perform the program operation based on an ISPP method. For example, the nonvolatile memory device 100 may perform the program operation through a plurality of second program loops PL1 through PLp. Each of the plurality of program loops PL1 through PLp may include program execution period in which program voltages VPGM1~VPGMk and VPGMk+1~VPGMp are applied and a verification period in which a verification voltage VPV is applied.

A program voltage difference ΔPGM between two successive program loops among the plurality of program loops PL1 through PLp may be constant. The control circuit 450 may control the voltage generator 500 such that the high voltage VPPH applied to the gate of the pass transistor and each of the program voltages VPGM1~VPGMk have a first voltage difference ΔV1 in each of the plurality of first program loops PL~PLk. The control circuit 450 may control the voltage generator 500 such that the high voltage VPPH applied to the gate of the pass transistor and each of the program voltages VPGMk+1~VPGMp have a second voltage difference ΔV2 smaller than the first voltage difference ΔV1 in each of the plurality of second program loops PLk+1~PLp.

Figure 17:
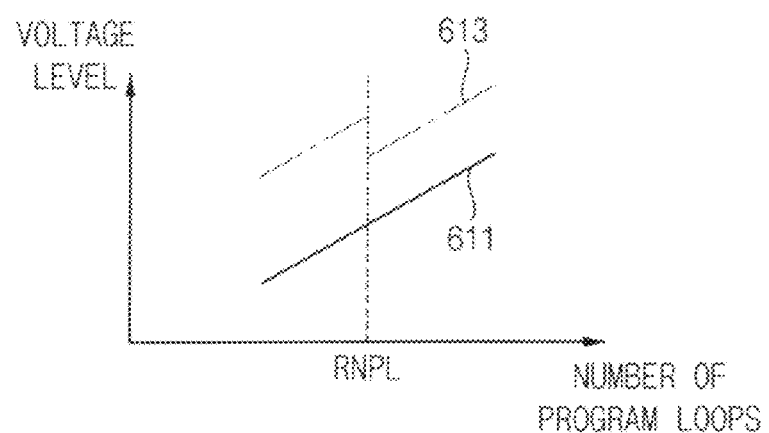
FIG. 17 illustrates voltage levels of the high voltage and the program voltage as a number of the program loops increase in FIG. 16.

FIG. 17 illustrates voltage levels of the high voltage and the program voltage as a number of the program loops increase in FIG. 16.

In FIG. 17, a reference numeral 611 denotes a voltage level of the program voltage as a number of the program loops increase in FIG. 16 and a reference numeral 613 denotes a voltage level of the high as a number of the program loops increase in FIG. 16.

Referring to FIG. 17, a voltage difference between the high voltage VPPG and the program voltage VPGM in case of a number of the program loops being smaller than a reference number RNPL is set to a higher value than a voltage difference between the high voltage VPPG and the program voltage VPGM in case of a number of the program loops being equal to or greater than the reference number RNPL.

The reference number RNPL may be determined at a specific number of program loops when a speed of program operation on at least a portion of program states of target memory cells based on at least one of program/erase cycle information, a number of target program states and an operating temperature of the nonvolatile memory device 100.

Figure 18:
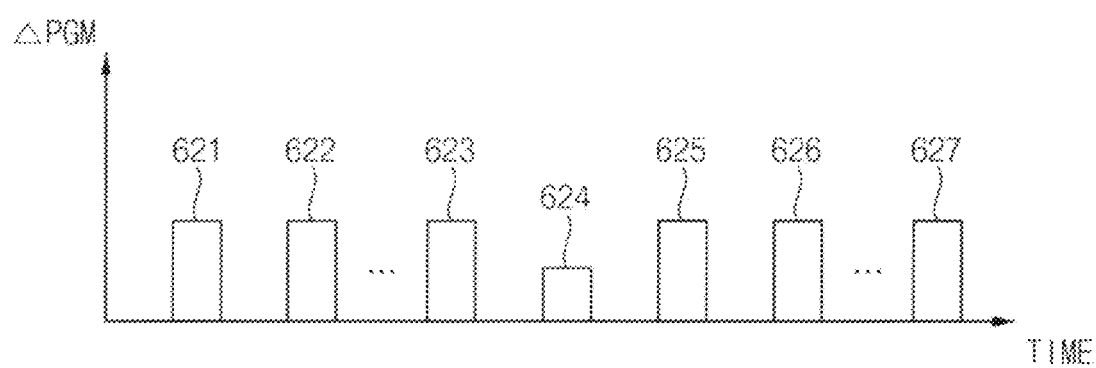
FIG. 18 illustrates a voltage difference between program voltages of two successive program loops in FIG. 17.

FIG. 18 illustrates a voltage difference between program voltages of two successive program loops in FIG. 17.

In FIG. 18, the x-axis may denote time and the y-axis may denote a program voltage difference ΔPGM.

In FIG. 18, reference numerals 611, 622, and 623 may denote program voltage differences in case of a number of the program loops being smaller than the reference number RNPL, reference numerals 625, 626 and, 627 may denote program voltage differences in case of a number of the program loops being greater than the reference number RNPL and a reference numeral 624 may denote a program voltage difference in case of a number of the program loops being similar with the reference number RNPL.

The control circuit 450 reduces the level of the high voltage VPPL with respect to the reference number RNPL, which has an effect of reducing a program voltage difference. Therefore, the nonvolatile memory device 100 may improve threshold voltage distributions of the target memory cells without reducing a voltage level pf the program voltage.

In the program operation with reference to FIGS. 13 through 18, the control circuit 450 (e.g., of FIG. 9A) may control the voltage generator 500 to adjust the level of the high voltage VPPH applied to a gate of the pass transistor coupled to the selected word-line based on the temperature code TCD. For example, the control circuit 450 may control the voltage generator 500 such that a first voltage difference between the high voltage VPPH and the program voltage VPGM in response to the operating temperature being greater than a reference temperature is smaller than a second voltage difference between the high voltage VPPH and the program voltage in response to the operating temperature being equal to or smaller than the reference temperature.

Figure 19:
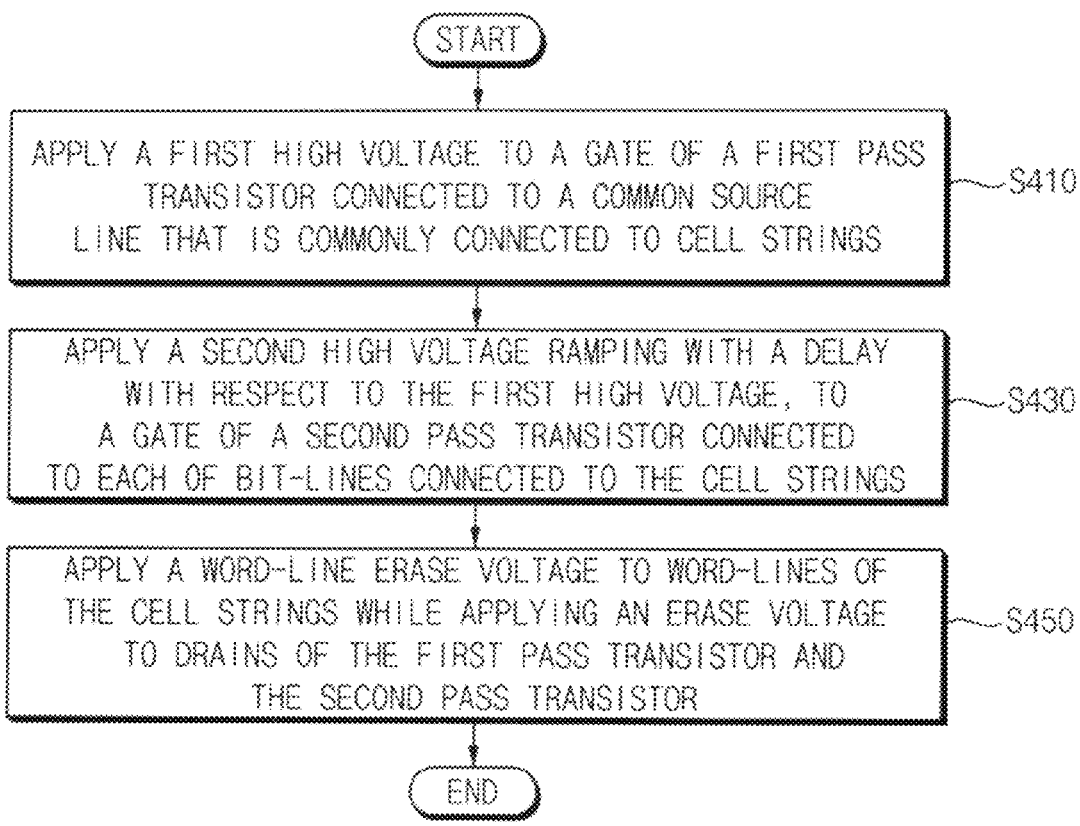
FIG. 19 is a flow chart illustrating a method of performing an erase operation in a nonvolatile memory device according to some example embodiments.

FIG. 19 is a flow chart illustrating a method of performing an erase operation in a nonvolatile memory device according to some example embodiments.

There is provided a method of performing an erase operation in a nonvolatile memory device 100 which includes at least one memory block including a plurality of cell strings where each of the plurality of cell strings includes a string selection transistor, a plurality of memory cells, and a ground selection transistor which are connected in series and disposed in a vertical direction between a bit-line and a common source line and a control circuit 450.

Referring to FIGS. 3 and 19, the control circuit 450 may control an erase operation on the at least one memory block, based on at least one of program/erase cycle information and an operating temperature during a program operation on the at least one memory block, by adjusting a level of a first high voltage applied to a gate of a first pass transistor coupled to the common source line, and a level of a second high voltage applied to a gate of a second pass transistor coupled to the bit-line such that the level of the first high voltage differs from the level of the second high voltage, applying an erase voltage to drains of the first pass transistor and the second pass transistor and applying a word-line erase voltage to at least a portion of word-lines coupled to the plurality of memory cells.

For example, the control circuit 450 may perform the erase operation by controlling the voltage generator 500 and the address decoder 300 to apply the first high voltage ramping to a target level, to the gate of the first pass transistor (operation S410), apply the second high voltage ramping to the target level with a more delay than the first high voltage, to the gate of the second pass transistor (operation S430) and apply the erase voltage to drains of the first pass transistor and the second pass transistor (operation S450). In addition, the control circuit 450 may control the voltage generator 500 and the address decoder 300 to apply an erase control voltage smaller than the erase voltage to gates of the string selection transistor and the ground selection transistor and apply the word-line erase voltage to the word-lines.

Figure 20:
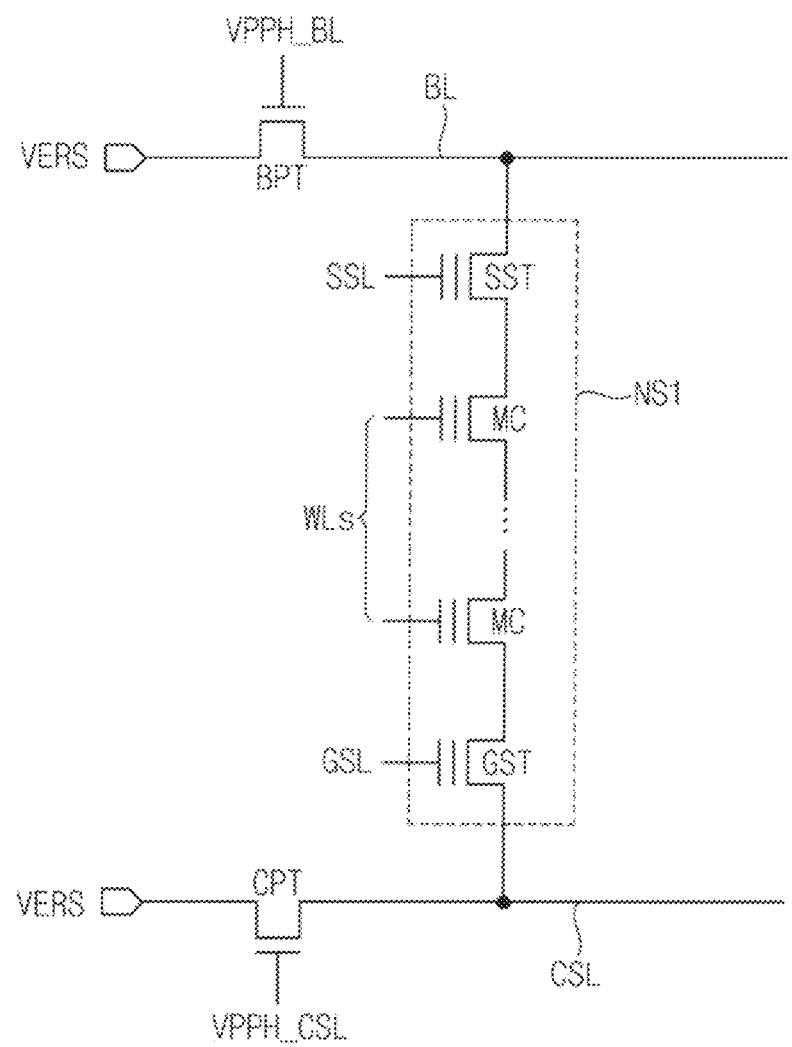
FIG. 20 illustrates a portion of the nonvolatile memory device on which the erase operation is performed.

FIG. 20 illustrates a portion of the nonvolatile memory device on which the erase operation is performed.

Referring to FIG. 20, a cell string NS1 connected between the bit-line BL and the common source line CSL is illustrated. The cell string NS1 includes a string selection transistor SST, a plurality of memory cells MCs and a ground selection transistor GST which are connected in series and disposed in a vertical direction between the bit-line BL and the common source line CSL.

The common source line CSL is connected to a first pass transistor CPT, and the control circuit 450 in FIG. 3 may control the address decoder 300 and the voltage generator 500 to apply a first high voltage VPPH_CSL to a gate of the first pass transistor CPT and apply an erase voltage VERS to a drain of the first pass transistor CPT during an erase operation.

The bit-line is connected to a second pass transistor BPT, and the control circuit 450 in FIG. 3 may control the address decoder 300 and the voltage generator 500 to apply a second high voltage VPPH_BL to a gate of the second pass transistor BPT and apply the erase voltage VERS to a drain of the second pass transistor BPT during an erase operation.

If the address decoder 300 applies a high voltage having the same level to the gates of the first pass transistor CPT and the second pass transistor BPT, holes injected to a channel of the cell string NS1 through the common source line CSL and holes injected to the channel through the bit-line BL may be different, e.g., due to doping difference and/or loading difference between the common source line CSL and the bit-line BL. When difference between the holes injected to the channel of the cell string NS1 through the common source line CSL and holes injected to the channel of the cell string NS1 through the bit-line BL occurs, erase speed may differ with respect to the common source line CSL and the bit-line BL. When the erase speed differs, the channel of the cell string NS1 may be incompletely erased and/or erase time of the channel of the cell string NS1 due to erase skew in the channel. When the channel of the cell string NS1 includes multi-stacks, these phenomenon may be worsened.

Figure 21:
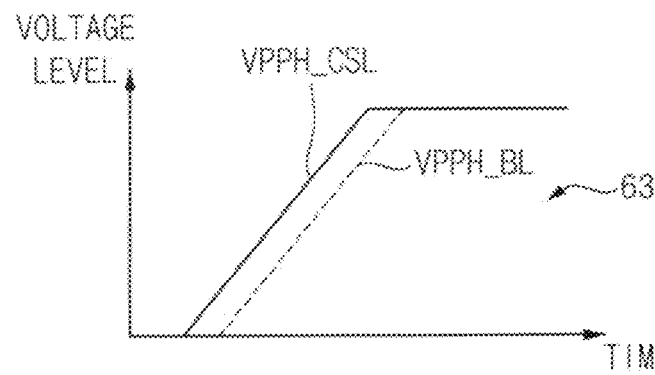
FIG. 21 illustrates voltage levels of voltages applied to the pass transistors in FIG. 20 according to some example embodiments.

FIG. 21 illustrates voltage levels of voltages applied to the pass transistors in FIG. 20 according to some example embodiments.

In FIG. 21, a reference numeral 631 denotes the first high voltage VPPH_CL applied to the gate of the first pass transistor CPT and the second high voltage VPPH_BL applied to the gate of the second pass transistor BPT and a reference numeral 633 denotes erase voltages VERS_CSL and VERS_BL applied to the common source line CSL and the bit-line BL, respectively.

Referring to FIGS. 20 and 21, the control circuit 450 controls the voltage generator 500 such that the first high voltage VPPH_CSL ramps to a target level and the second high voltage VPPH_BL CL ramps to the target level with a delay with respect to the first high voltage VPPH_CL. Therefore, the erase voltage VERS_CSL applied to the common source line CSL ramps to a target level as the erase voltage VERS ramps to the target level and the erase voltage VERS_BL applied to the bit-line ramps to the target level with a voltage difference α. Accordingly, the holes injected to a channel of the cell string NS1 through the common source line CSL and holes injected to the channel through the bit-line BL may be uniform and the erase skew may be prevented.

Figure 22:
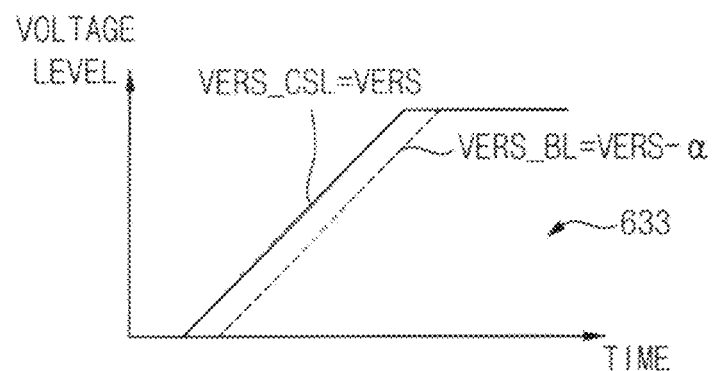
FIG. 22 illustrates an eras bias condition in an erase operation on the cell string in FIG. 20.

FIG. 22 illustrates an eras bias condition in an erase operation on the cell string in FIG. 20.

Referring to FIGS. 20 and 22, the control circuit 450, in an erase operation on the cell string NS1, controls the address decoder 300 and the voltage generator 500 to apply the erase voltage VERS to the common source line CSL, to apply an erase voltage VERS- a ramping with a delay to the bit-line BL, to apply an erase control voltage VGDL smaller than the erase voltage VERS to gates of the string selection transistor SST and the ground selection transistor GST and to apply a word-line erase voltage VWE similar with the ground voltage VSS to the word-lines WLs.

When the erase control voltage VGDL is applied to the gates of the string selection transistor SST and the ground selection transistor GST, a GIDL current may be generated in the string selection transistor SST and the ground selection transistor GST due to the voltage difference between a drain and a gate of each of the string selection transistor SST and the ground selection transistor GST, and the erase voltage VERS may be provided to a channel of the cell string NS1 along the holes due to the GIDL current. Tunneling (for example, Fowler-Nordheim tunneling) is caused due to a voltage difference between the erase voltage VERS and the word-line erase voltage VWE, holes are injected in a charge storage layer of the memory cells MCs and data of the memory cells MCs. Therefore, without being limited to a particular theory, a threshold voltage of the memory cells MCs may be reduced to a voltage level of erased state.

When the erase control voltage VGDL is applied to the gates of the string selection transistor SST and the ground selection transistor GST, the GIDL current may be generated in the string selection transistor SST disposed in an upper portion of the cell string NS1 and the ground selection transistor GST in a lower portion of the cell string NS1, and holes may be injected from above and under a channel region, that is, from two directions.

In order to generate the GIDL current, the erase voltage VERS and the erase control voltage VGDL may be maintained at a uniform voltage difference. According to some example embodiments, a voltage level of the bit-line BL and the common source line CSL may be increased, and the erase control voltage VGDL may be applied to the string selection line SSL and the grounds election line GSL at a time point at which the voltage level of the bit-line BL and the common source line CSL is equal to or higher than a GIDL voltage level. After the voltage level of the bit-line BL and the common source line CSL reaches the erase voltage VERS and a voltage level of the string selection line SSL and the ground selection line GSL reaches the erase control voltage VGDL, the erase voltage VRES and the erase control voltage VGDL are blocked at a time after a predetermined (and/or otherwise determined) period of time, and the erase operation may be completed.

Figure 23A:
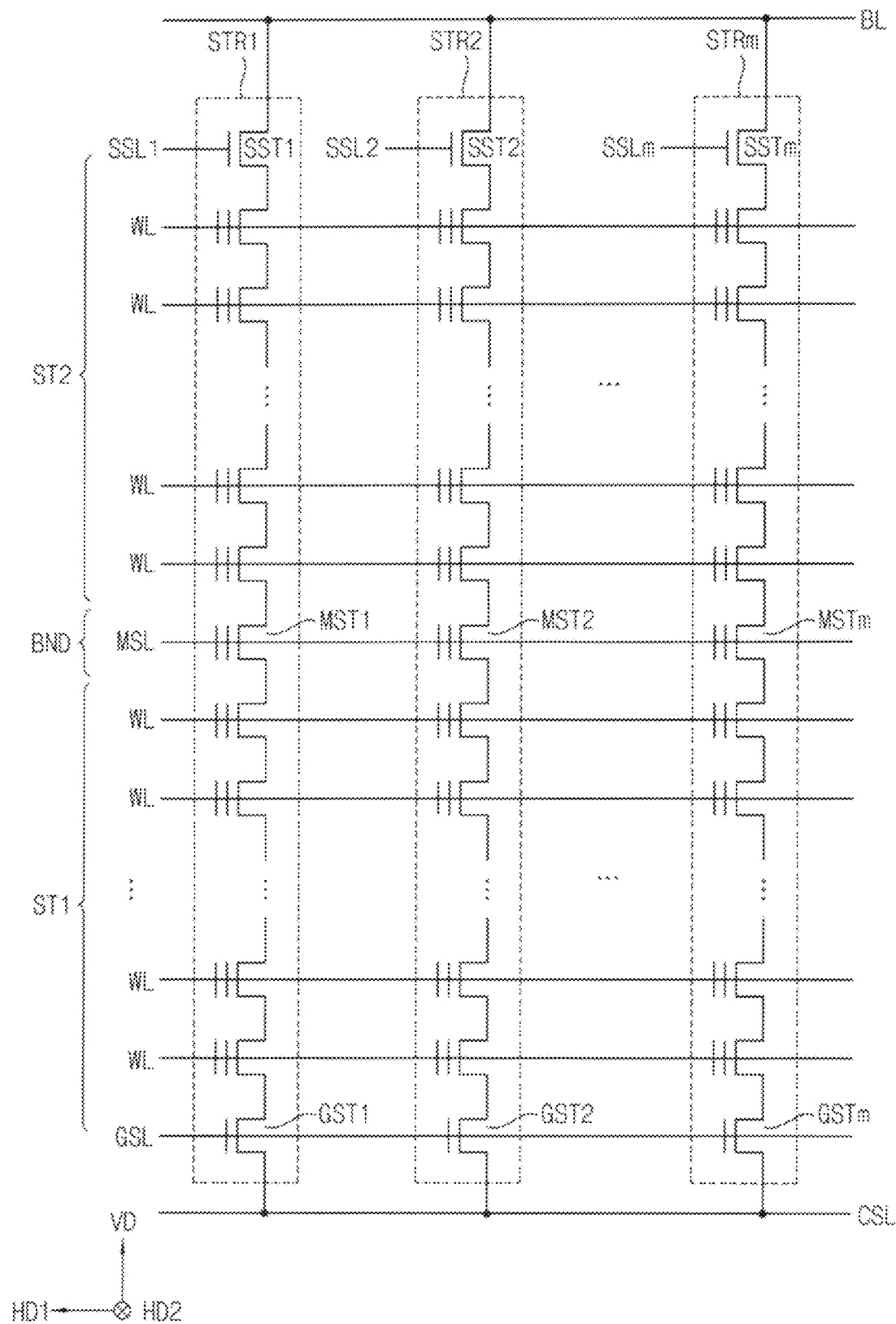
FIG. 23A is a circuit diagram illustrating a structure of a memory cell array according to some example embodiments.
Figure 23B:
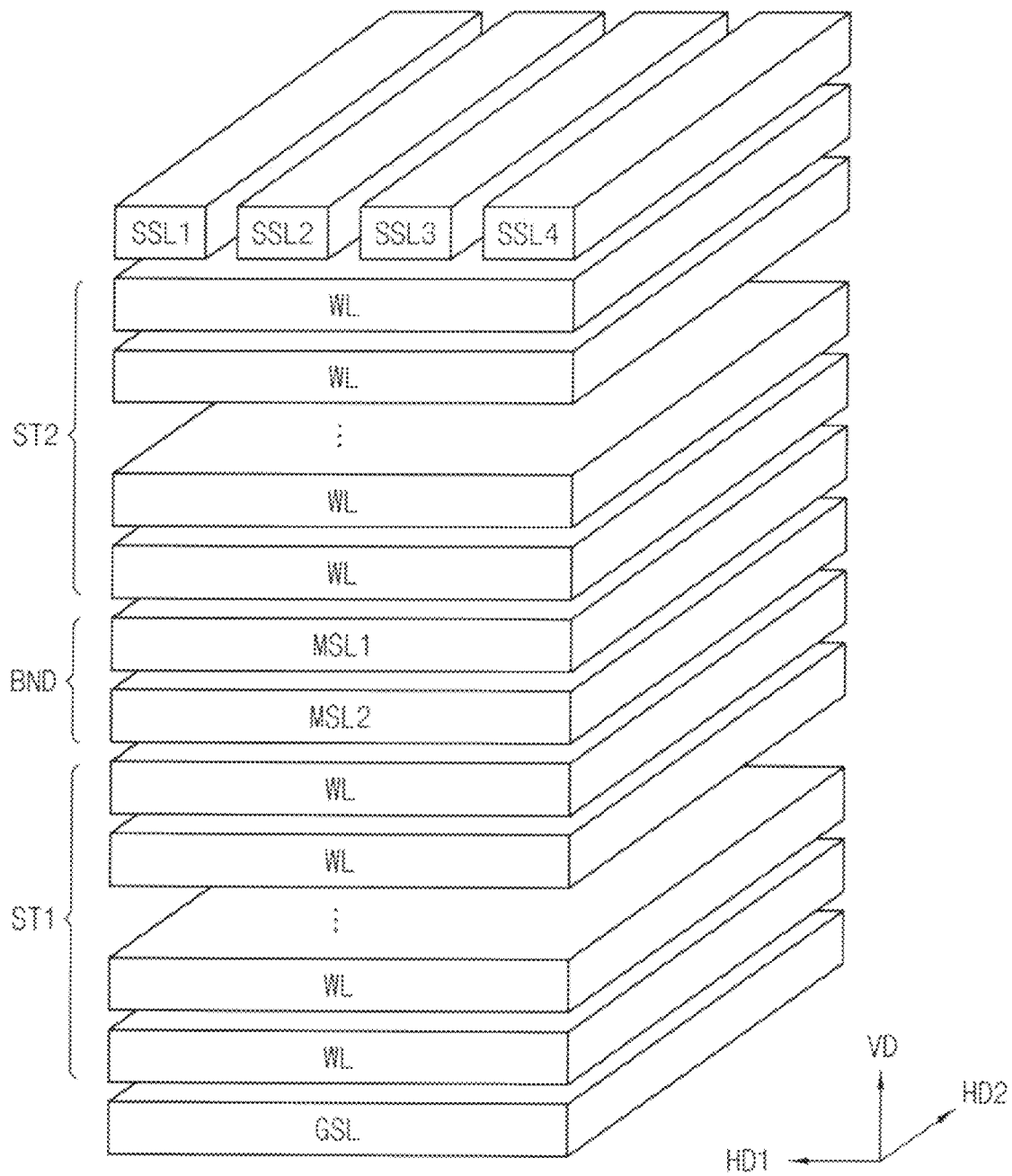
FIG. 23B is a perspective view illustrating a memory block corresponding to a structure of FIG. 23A.

FIG. 23A is a circuit diagram illustrating a structure of a memory cell array according to some example embodiments, and FIG. 23B is a perspective view illustrating a memory block corresponding to a structure of FIG. 23A.

FIG. 23A illustrates two-dimensional version of a memory block including cell strings connected to one bit-line BL and one source line CSL for convenience of illustration, but it will be understood that the memory block may have a three-dimensional structure of a plurality of bit-lines as described with reference to FIGS. 4 and 5.

Referring to FIGS. 23A and 23B, a memory block may include a plurality of cell strings STR1~STRm connected between a bit-line BL and a common source line CSL. The cell strings STR1~STRm may include string selection transistors SST1~SSTm controlled by string selection lines SSL1~SSLm, memory cells controlled by word-lines WL, intermediate switching transistors MST1~MSTm controlled by an intermediate switching line MSL and a ground selection transistors GST1~GSTm controlled by a ground selection line GSL, respectively. Here, m is a natural number greater than 1. The memory cells connected to word-lines disposed in edge portions of the stacks ST1 and ST2 in the vertical direction VD may be dummy cells. In some example embodiments, the dummy cells may not store data and/or may store data having bits smaller than bits in a data stored in the memory cells.

FIGS. 23A and 23B illustrate an example wherein the ground selection transistors GST1~GSTm are connected to the same ground selection line GSL. In other examples, the ground selection transistors are connected to the respective ground selection lines.

In some example embodiments, as illustrated in FIGS. 23A and 23B, the boundary portion BND may include one gate line MSL that switches or activates simultaneously the intermediate switching transistors connected thereto.

Figure 24:
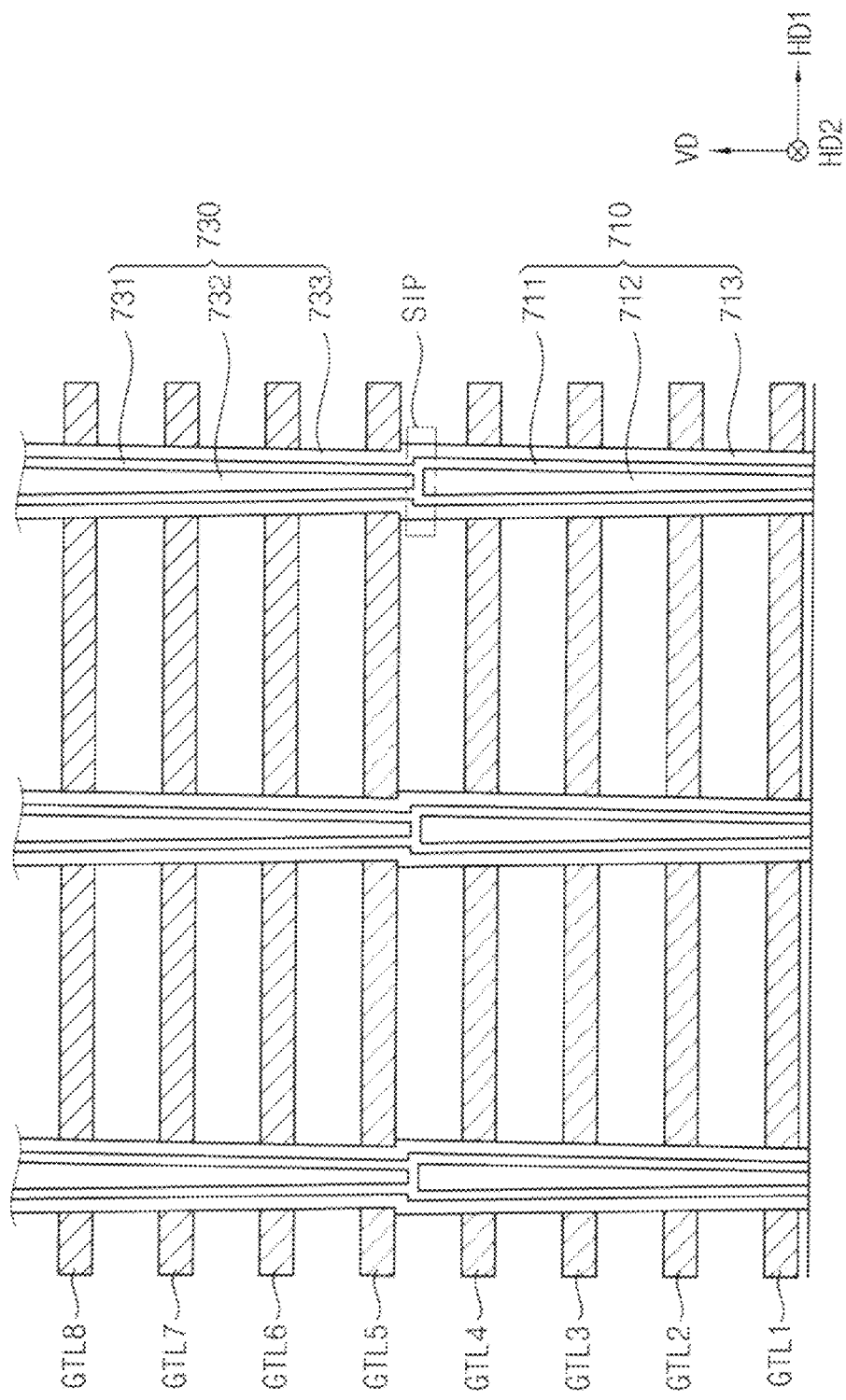
FIG. 24 is a cross-sectional view for describing an example of a boundary portion included in a memory block according to some example embodiments.

FIG. 24 is a cross-sectional view for describing an example of a boundary portion included in a memory block according to some example embodiments.

Referring to FIG. 24, a channel hole of each cell string STR may include a first sub channel hole 710 and a second sub channel hole 730 stacked in the vertical direction VD. A channel hole may be referred to as a pillar. The first sub channel hole 710 may include a channel layer 711, an inner material 712, and an insulation layer 713. The second sub channel hole 730 may include a channel layer 731, an inner material 732, and an insulation layer 733. The channel layer 711 of the first channel hole 710 may be connected to the channel layer 731 of the second sub channel hole 730 through, e.g., a P-type silicon pad SIP. The sub channel holes 710 and 730 may be formed using a stopper line GTL5 having an appropriate etch rate. For example, in some example embodiments, the stopper line GTL5 may be formed of polysilicon and the other gate lines GTL1~GTL4 and the GTL7~GTL8 may be formed of metal such as tungsten to implement the appropriate etch rate.

The above-described boundary portion BND may correspond to the stopper layer GTL5 that is used to form the plurality of sub channel holes. The cells in the stopper layer GTL5 may be improper for storing data, and the stopper layer may be used as the boundary portion BND to from the intermediate switching transistors. The example embodiments are not limited to a boundary portion of one stopper layer, and the boundary portion may include two or more gate layers.

Figure 25A:
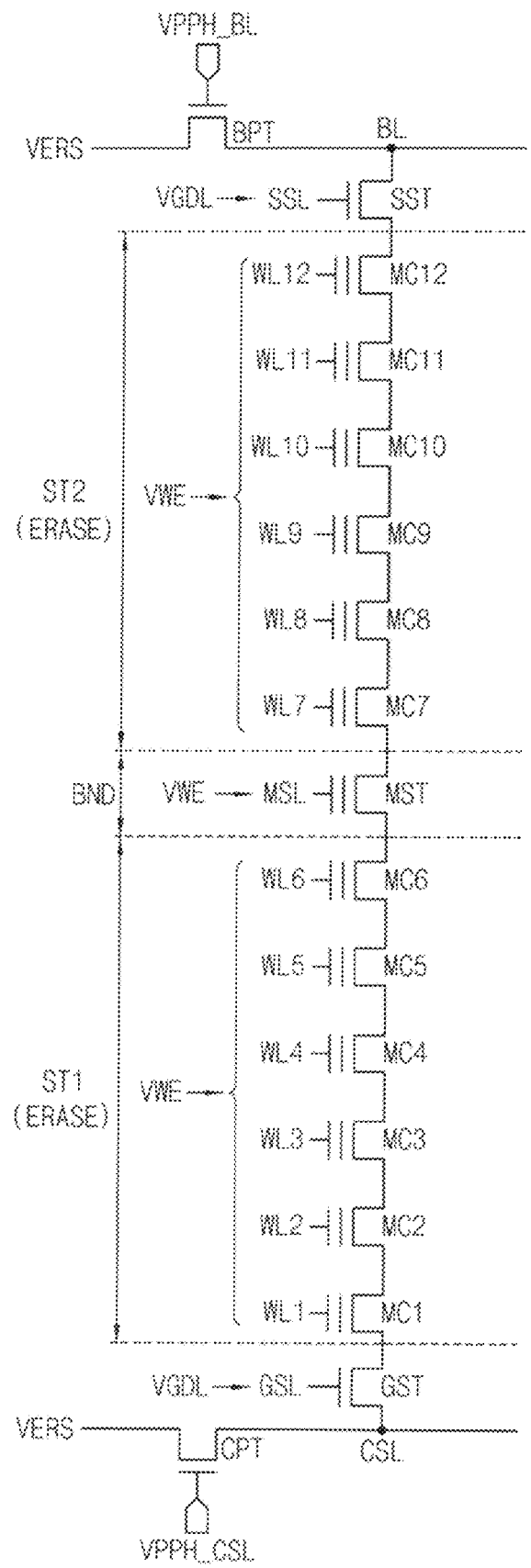
FIG. 25A illustrates an erase operation of a nonvolatile memory device according to some example embodiments.
Figure 25B:
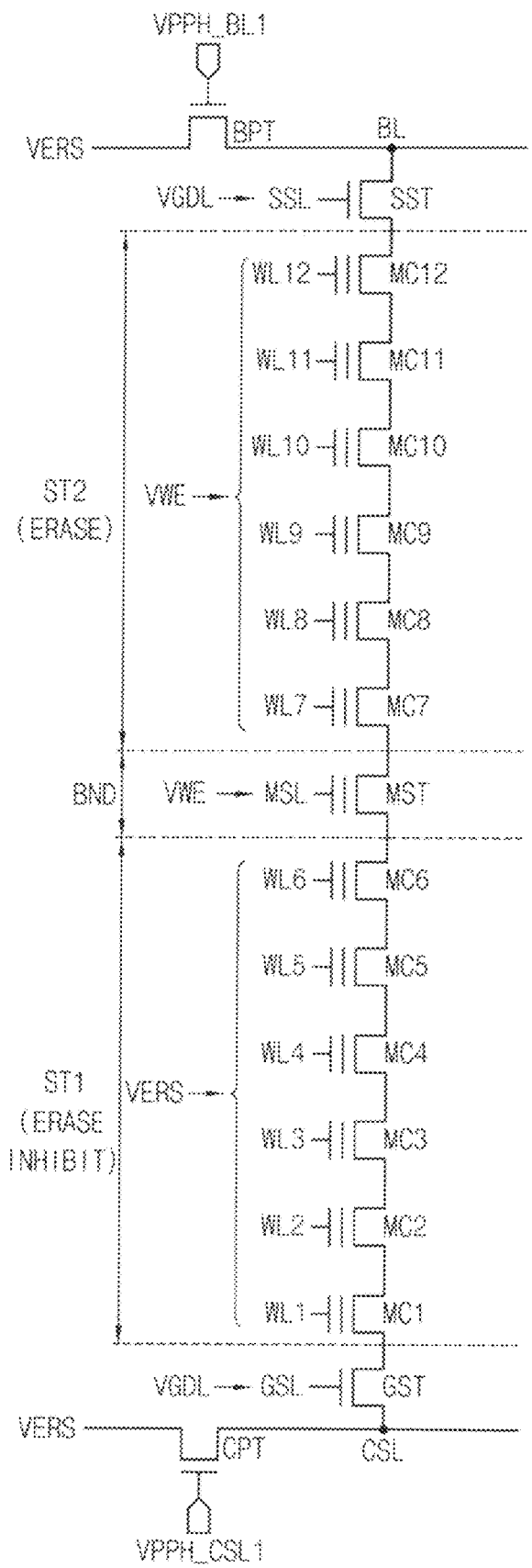
FIG. 25B illustrates a partial erase operation of a nonvolatile memory device according to some example embodiments.

FIG. 25A illustrates an erase operation of a nonvolatile memory device according to some example embodiments, and FIG. 25B illustrates a partial erase operation of a nonvolatile memory device according to some example embodiments.

FIGS. 25A and 25B respectively illustrate one cell string including a string selection transistor SST connected to a string selection line SSL, memory cells MC1~MC12 connected to word-lines WL1~WL12, an intermediate switching transistor MST connected to an intermediate switching line MSL, and a ground selection transistor GST connected to a ground selection line GSL. The cell string is connected between a bit-line BL and a common source line CSL in the vertical.

In FIGS. 25A and 25B, one cell string among a plurality of cell strings is illustrated. FIG. 25A illustrates an erase operation on a first stack ST1 and a second stack ST2 and FIG. 25B illustrates a partial erase operation in which the first stack ST1 is erase-inhibited and the second stack ST2 is erased.

Referring to FIG. 25A, in order to erase the first stack ST1 and the second stack ST2, the control circuit (e.g., 450 in FIG. 3) controls the address decoder 300 and the voltage generator 500, in an erase operation, to apply the first high voltage VPPH_CSL to the gate of the first pass transistor CPT, to apply the second high voltage VPPH_BL to the gate of the second pass transistor BPT, and to apply the erase voltage VERS to the drains of the first pass transistor CPT and the second pass transistor BPT.

In addition, the control circuit 450, in the erase operation, controls the address decoder 300 and the voltage generator 500 to apply the erase control voltage VGDL smaller than the erase voltage VERS to gates of the string selection transistor SST and the ground selection transistor GST, and to apply the word-line erase voltage VWE similar with the ground voltage VSS to word-lines of the first stack ST1, word-lines of the second stack ST2 and a gate of the intermediate switching transistor GST through intermediate switching line MSL.

Therefore, the holes injected to a channel of the first stack ST1 through the common source line CSL and holes injected to a channel of the second stack ST2 through the bit-line BL may be uniform and the erase skew may be prevented.

Referring to FIG. 25B, in order to erase-inhibit the first stack ST1 and to erase the second stack ST2, the control circuit 450 in FIG. 3, in an erase operation, controls the address decoder 300 and the voltage generator 500 to apply a second high voltage VPPH_BL1 to the gate of the second pass transistor BPT, to apply a first high voltage VPPH_CSL1 to the gate of the first pass transistor CPT, to apply the second high voltage VPPH_BL to the gate of the second pass transistor BPT, and to apply the erase voltage VERS to the drains of the first pass transistor CPT and the second pass transistor BPT.

In addition, the control circuit 450, in the erase operation, controls the address decoder 300 and the voltage generator 500 to apply the erase control voltage VGDL smaller than the erase voltage VERS to gates of the string selection transistor SST and the ground selection transistor GST, to apply erase voltage VERS to word-lines of the first stack ST1 and to apply the word-line erase voltage VWE similar with the ground voltage VSS to word-lines of the second stack ST2 and a gate of the intermediate switching transistor GST through intermediate switching line MSL.

Figure 26:
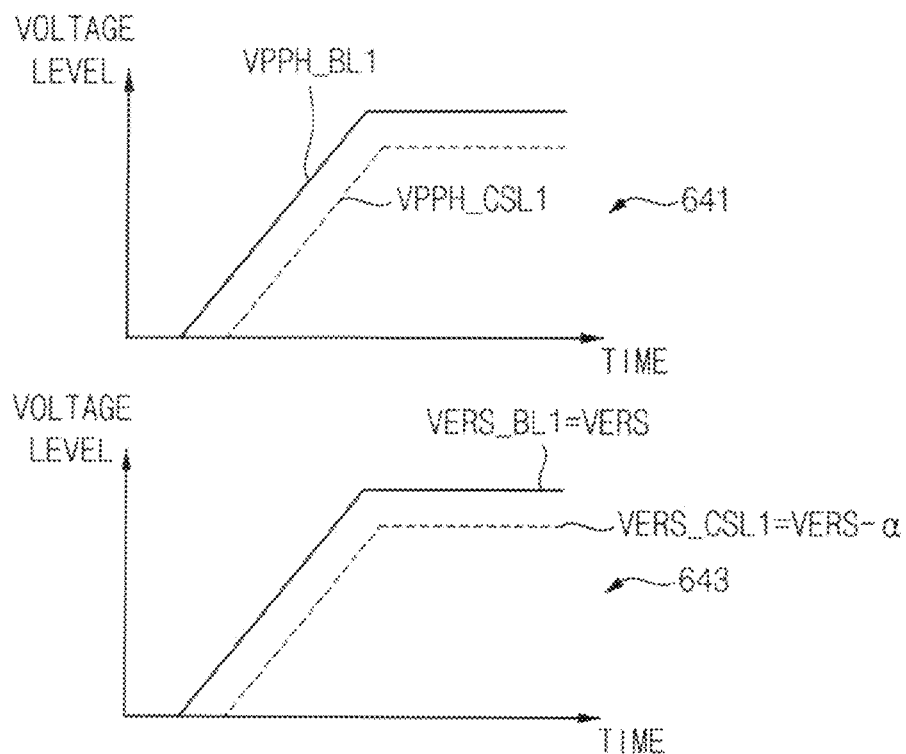
FIG. 26 illustrates voltage levels of voltages applied to the pass transistors in FIG. 25B according to some example embodiments.

FIG. 26 illustrates voltage levels of voltages applied to the pass transistors in FIG. 25B according to some example embodiments.

In FIG. 26, a reference numeral 641 denotes the second high voltage VPPH_BL1 applied to the gate of the second pass transistor BPT the first high voltage VPPH_CSL1 applied to the gate of the first pass transistor CPT and a reference numeral 643 denotes erase voltages VERS_CSL1 and VERS_BL1 applied to the common source line CSL and the bit-line BL, respectively.

Referring to FIGS. 25B and 26, the control circuit 450 controls the voltage generator 500 such that the second high voltage VPPH_BL1 ramps to a first target level and the first high voltage VPPH_CSL1 ramps to a second target level smaller than the first target level with a delay with respect to the second high voltage VPPH_BL1. Therefore, the erase voltage VERS_BL1 applied to the bit-line BL ramps to a first target level as the erase voltage VERS ramps to the first target level and the erase voltage VERS_CSL1 applied to the common source line CSL ramps to a second target level smaller than the first target level with a voltage difference α. Accordingly, a voltage difference between the erase voltage VRES applied to a channel of the first stack ST1 and the erase voltage VRES_CSL1 applied to the common source line CSL may be reduced and the break down that may occur in the ground selection transistor GST may be reduced and/or prevented.

In the erase operation and the partial erase operation with reference to FIGS. 19 through 26, the control circuit 450 of FIG. 9A may control the voltage generator 500 to adjust the level of the high voltage applied to a gate of the pass transistor coupled to the selected word-line based on the temperature code TCD. For example, the control circuit 450 may control the voltage generator 500 such that a first voltage difference between the high voltage and the erase voltage in response to the operating temperature being greater than a reference temperature is smaller than a second voltage difference between the high voltage and the erase voltage in response to the operating temperature being equal to or smaller than the reference temperature.

Figure 27:
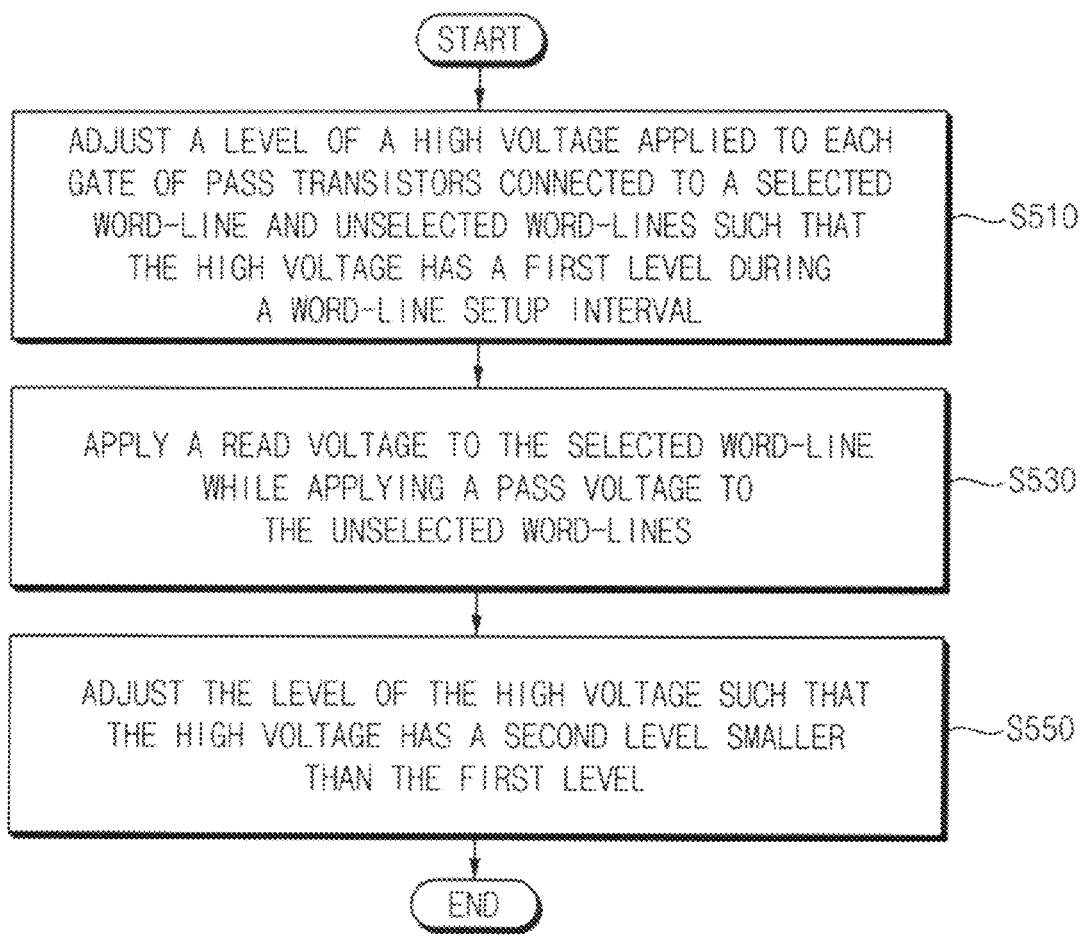
FIG. 27 is a flow chart illustrating a method of performing a read operation in a nonvolatile memory device according to some example embodiments.

FIG. 27 is a flow chart illustrating a method of performing a read operation in a nonvolatile memory device according to some example embodiments.

For example, provided is a method of performing a read operation in a nonvolatile memory device 100 which includes at least one memory block including a plurality of cell strings where each of the plurality of cell strings includes a string selection transistor, a plurality of memory cells and a ground selection transistor which are connected in series and disposed in a vertical direction between a bit-line and a common source line and a control circuit 450. The method may be implemented by and/or in, e.g., any of the above example embodiments, and is described in relation to the nonvolatile memory device 100 of FIG. 3.

Referring to FIGS. 3 and 27, the control circuit 450 may control a read operation on a target memory cells, based on at least one of read cycle information of the target memory cells and an operating temperature during a read operation on the target memory cells, by adjusting a level of a high voltage, applied to each gate of pass transistors coupled to a plurality of word-lines coupled to the plurality of memory cells, to have a first level, in a word-line set-up interval (operation S510), applying a read voltage to a selected word-line among the plurality of word-lines while applying a pass voltage to unselected word-lines among the plurality of word-lines (operation S530) and adjusting the level of the high voltage to have a second level smaller than the first level after the read voltage and the pass voltage arrive at respective target levels (operation S550).

Figure 28:
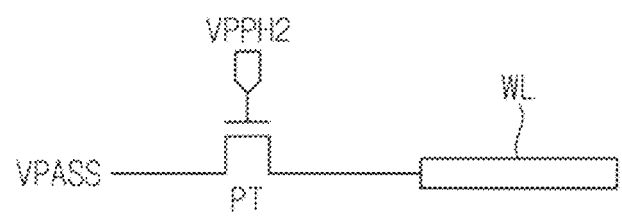
FIG. 28 illustrates an unselected word-line and a pass transistor associated with a method of FIG. 27
Figure 29:
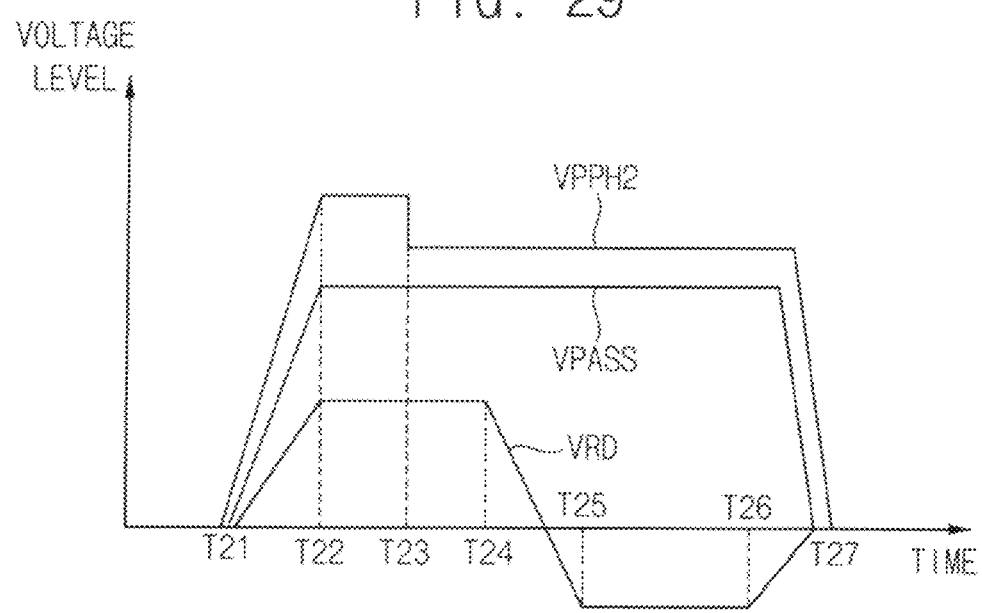
FIG. 29 illustrates levels of voltages associated with a method of FIG. 27.

FIG. 28 illustrates an unselected word-line and a pass transistor associated with a method of FIG. 27 and FIG. 29 illustrates levels of voltages associated with a method of FIG. 27.

Referring to FIG. 28, a pass transistor PT is connected to an unselected word-line WL, a high voltage VPPH2 is applied to a gate of the pass transistor PT and a pass voltage VPASS is applied to a drain of the pass transistor PT.

Referring to FIGS. 27 through 29, the control circuit 450, based on at least one of read cycle information of the target memory cells and an operating temperature, controls the voltage generator 500 to adjust a level of a high voltage VPPH2 applied to the gate of the pass transistor PT to have a first level, to adjust a level of a pass voltage VPASS applied to the drain of the pass transistor PT to have a level smaller than the first level and to adjust a level of a read voltage VRD applied to a selected word-line to have a level smaller than the pass voltage VPASS during word-line set-up interval T21~T22.

During an interval T22~T23, the pass voltage VPASS and the read voltage VRD arrive at respective target levels, and the control circuit 450 controls the voltage generator 500 to adjust the level of the high voltage VPPH2 to have a second level smaller than the first level during an interval T23~T26 after the interval T22~T23. During the interval T23~T26, the pass voltage VPASS may have a target level. The read voltage VRD may have a target level during an interval T23~T24, may be reduced to a negative voltage level from the target level during an interval T24~T25 and may have the negative voltage level during an interval T25~T26. During an interval T26~T27, the high voltage VPPH2 and the pass voltage VPASS may be reduced to the ground voltage and the read voltage VRD may increase to the ground voltage.

When the control circuit 450 controls the voltage generator 500 such that the high voltage VPPH has the second level smaller than the first level and greater than the pass voltage VPASS, the level of the high voltage VPPH2 applied to gates of the pass transistors connected to unselected word-lines is reduced, and thus reliability of the pass transistors may be enhanced and power consumption may be reduced.

In the read operation with reference to FIGS. 27 through 29, the control circuit 450 of FIG. 9A may control the voltage generator 500 to adjust the level of the high voltage VPPH2 applied to the unselected word-lines based on the temperature code TCD. For example, the control circuit 450 may control the voltage generator 500 such that the level of the high voltage VPPH2 in response to the operating temperature being greater than a reference temperature is smaller than the level of the high voltage VPPH2 in response to the operating temperature being equal to or smaller than the reference temperature based on the temperature code.

Figure 30:
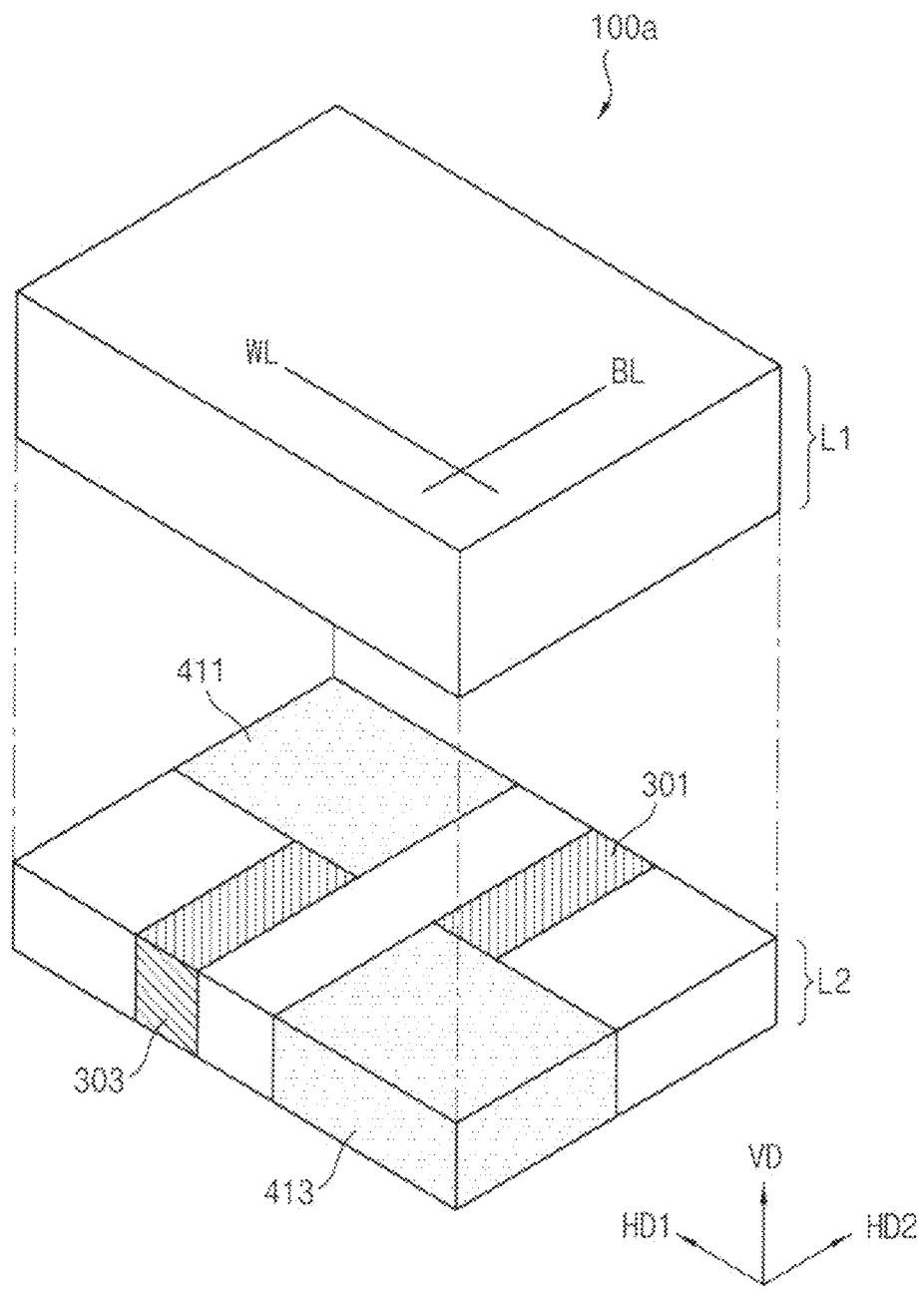
FIG. 30 is a view illustrating a structure of the nonvolatile memory device including the first and second semiconductor layers according to some example embodiments.

FIG. 30 is a view illustrating a structure of the nonvolatile memory device including the first and second semiconductor layers according to some example embodiments. FIG. 31 is a plan view illustrating a top surface of the second semiconductor layer contacting the first semiconductor layer of the nonvolatile memory device according to some example embodiments.

In FIG. 30, the first and second semiconductor layers L1 and L2 are spaced apart from each other in the vertical direction VD for convenience of explanation. However, a bottom surface of the first semiconductor layer L1 and the top surface of the second semiconductor layer L2 actually contact each other.

Referring to FIGS. 30 and 31, the first and second address decoders 301 and 303, which may be included in the address decoder 300 in FIG. 3, may extend in a second horizontal direction HD2 perpendicular to a first horizontal direction HD1 in which word-lines WL extend. In addition, the first and second page buffer circuits 411 and 413, which may be included in the page buffer circuit 410 in FIG. 3, may extend in the first horizontal direction HD1 (e.g., the first horizontal direction HD1 in which the bit-lines BL are arranged). For example, in a nonvolatile memory device 100a having a cell-over-peri (COP) structure, the row decoder 300 (see FIG. 3) and the page buffer circuit 410 (see FIG. 3) may be divided into two or more parts and may be arranged as shown in FIGS. 30 and 31 to increase the area of the address decoder 300 and the page buffer circuit 410 overlapping the memory cell array 200 (see FIG. 3) of the first semiconductor layer L1 in the third direction.

Referring to FIG. 31, the second semiconductor layer L2 may be divided into first through fourth regions R1 through R4 by a first virtual line X0-X0' in the first horizontal direction HD1 parallel to the word-lines WL and a second virtual line Y0-Y0' in the second horizontal direction HD2 parallel to the bit-lines BL.

For example, the first virtual line X0-X0' and the second virtual line Y0-Y0' may overlap the memory cell array 200 (see FIG. 3) located on the first semiconductor layer L1 in the vertical direction VD. In some example embodiments, at least a part of each of the first through fourth regions R1 through R4 may overlap the memory cell array 200 located on the first semiconductor layer L1 in the vertical direction VD. The first and second address decoders 301 and 303 may be respectively located in the second and third regions R2 and R3, and the first and second page buffer circuits 411 and 413 may be respectively located in the first and fourth regions R1 and R4.

Figure 32:
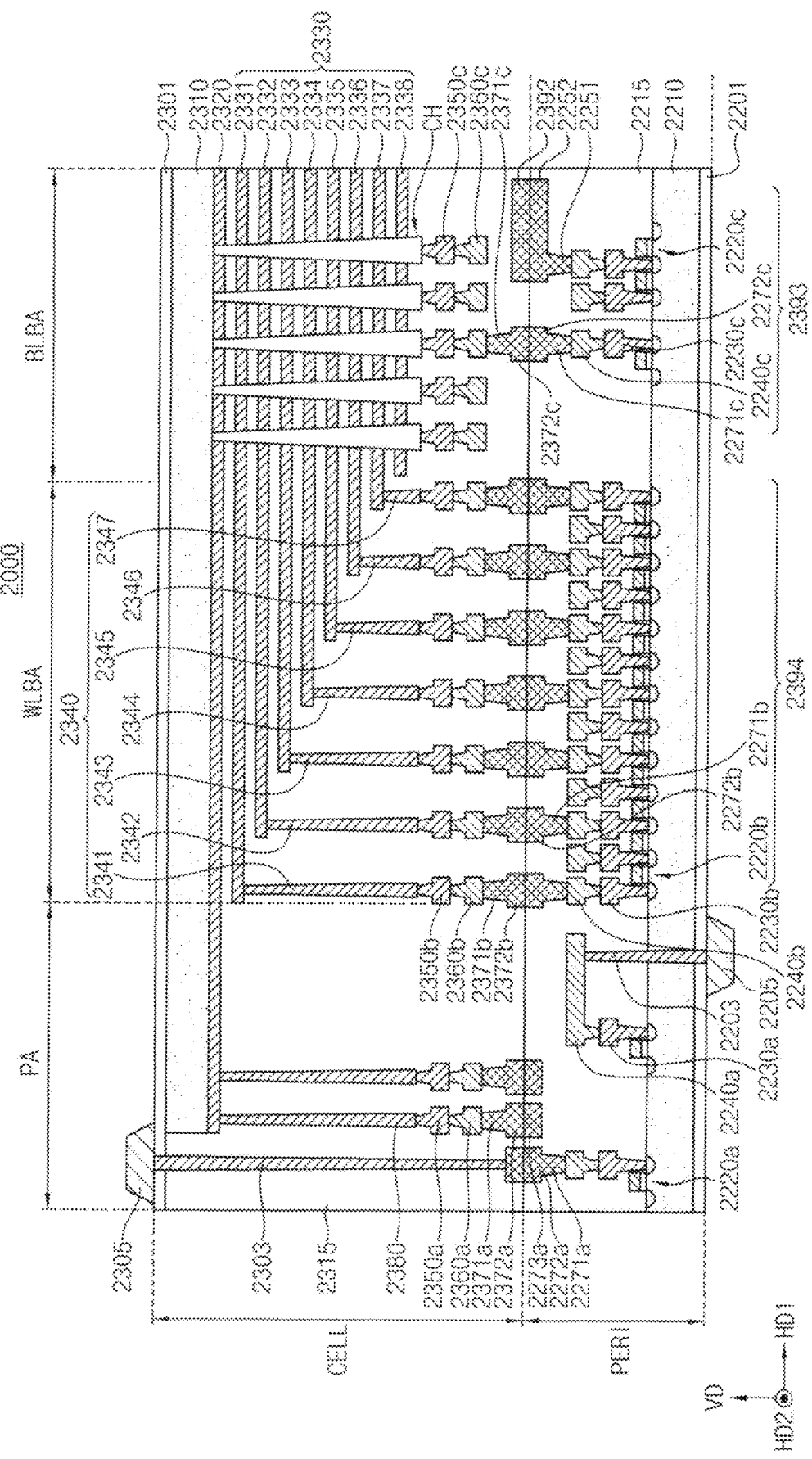
FIG. 32 is a cross-sectional view of a nonvolatile memory device according to some example embodiments.

FIG. 32 is a cross-sectional view of a nonvolatile memory device according to some example embodiments.

Referring to FIG. 32, a nonvolatile memory device or a memory device 2000 may have a chip-to-chip (C2C) structure. The C2C structure may refer to a structure formed by manufacturing an upper chip including a memory cell region (and/or a cell region) CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, in some example embodiments, the bonding metals may include copper (Cu) and may use a Cu-to-Cu bonding. The example embodiments, however, are not limited thereto. For example, the bonding metals may also be formed of and/or include aluminum (Al) and/or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements (e.g., 2220a, 2220b, and 2220c) formed on the first substrate 2210, first metal layers (e.g., 2230a, 2230b, and 2230c) respectively connected to the plurality of circuit elements (e.g., 2220a, 2220b, and 2220c), and second metal layers (e.g., 2240a, 2240b, and 2240c) formed on the first metal layers (e.g., 2230a, 2230b, and 2230c). In some example embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In the example illustrate in FIG. 32, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, and/or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of a conductive material such as aluminum, copper, tungsten, and/or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word-lines 2330 (e.g., word-lines 2331, 2332, 2333, 2334, 2335, 2336, 2337, and 2338) may be stacked in the vertical direction VD, perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and/or the like, and the channel layer may be electrically connected to a first metal layer 2350c and a second metal layer 2360c. For example, the first metal layer 2350c may be a bit-line contact, and the second metal layer 2360c may be a bit-line. In an example embodiment, the bit-line 2360c may extend in a second horizontal direction HD2, parallel to the upper surface of the second substrate 2310.

In the example illustrated in FIG. 32, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first horizontal direction HD1, parallel to the upper surface of the second substrate 2310 and perpendicular to the second horizontal direction HD2, and may be connected to a plurality of cell contact plugs 2340 (e.g., the cell contact plugs 2341, 2342, 2343, 2344, 2345, 2346, and 2347). The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In some example embodiments, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, and/or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to some example embodiments, the second substrate 2310 and the common source line 2320 may not be disposed in an area in which the second input/output contact plug 2303 is disposed. For example, in some example embodiments, the second input/output pad 2305 may not overlap the word-lines 2330 in the vertical direction VD. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to some example embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In some example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The above-mentioned word-line voltages and high voltage may be applied to at least one memory block in the cell region CELL through the lower bonding metals 2271b and 2272b in the peripheral circuit region PERI and upper bonding metals 2371b and 2372b of the cell region CELL. The control circuit may adjust levels of high voltages applied to gates of pass transistors connected to a selected word-line and unselected word-lines of at least one memory block as described above.

A nonvolatile memory device or a storage device according to example embodiments may be packaged using various package types or package configurations. In this disclosure, except when expressly indicated otherwise, the functional blocks that denote elements that process (and/or perform) at least one function or operation may be included in and/or implemented as (and/or in) processing circuitry such hardware, software, or the combination of hardware and software.

The inventive concepts may be applied to various devices and systems that include the nonvolatile memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A nonvolatile memory device comprising:
   at least one memory block including a plurality of cell strings, each of the plurality of cell strings including a string selection transistor, a plurality of memory cells and a ground selection transistor in series between a bit-line and a common source line in a vertical direction; and
   a control circuit configured to, during an erase operation on the at least one memory block,
   adjust a level of a first high voltage applied to a gate of a first pass transistor coupled to the common source line and a level of a second high voltage applied to a gate of a second pass transistor coupled to the bit-line such that the level of the first high voltage differs from the level of the second high voltage,
   apply an erase voltage to drains of the first pass transistor and the second pass transistor, and apply a word-line erase voltage to at least a portion of word-lines coupled to the plurality of memory cells, wherein the levels of the first high voltage and the second high voltage are adjusted based on at least one of program/erase cycle information or an operating temperature during the erase operation on the at least one memory block.

2. The nonvolatile memory device of claim 1, further comprising:
a voltage generator configured to generate word-line voltages including the first high voltage, the second high voltage, the erase voltage, and the word-line erase voltage based on control signals from the control circuit; and
an address decoder configured to provide the word-line voltages to the at least one memory block based on a row address,
wherein the control circuit is configured to control the voltage generator and the address decoder based on a command and an address including the row address.

3. The nonvolatile memory device of claim 2, wherein the control circuit is configured to control the voltage generator such that
the first high voltage ramps to a target level; and
the voltage generator generates the second high voltage by ramping the first high voltage with a delay.

4. The nonvolatile memory device of claim 2, wherein the control circuit is configured to control the voltage generator and the address decoder to:
apply the first high voltage ramping to a target level to the gate of the first pass transistor,
apply the second high voltage ramping to the target level, with a delay with respect to the first high voltage, to the gate of the second pass transistor,
apply the erase voltage to the drains of the first pass transistor and the second pass transistor,
apply an erase control voltage to gates of the string selection transistor and the ground selection transistor, the erase control voltage being smaller than the erase voltage, and
apply the word-line erase voltage to the portion of word-lines.

5. The nonvolatile memory device of claim 2,
wherein the plurality of cell strings are divided, in the vertical direction, into at least a first stack and a second stack,
wherein the at least one memory block further includes a plurality of intermediate switching transistors in a boundary portion between the first stack and the second stack, and the plurality of intermediate switching transistors are configured to perform a switching operation to control electrical connection of the plurality of cell strings, respectively.

6. The nonvolatile memory device of claim 5, wherein the control circuit is configured to control the voltage generator and the address decoder to
apply the first high voltage ramping to a target level to the gate of the first pass transistor,
apply the second high voltage ramping to the target level, with a delay with respect to the first high voltage, to the gate of the second pass transistor,
apply the erase voltage to the drains of the first pass transistor and the second pass transistor,
apply an erase control voltage to gates of the string selection transistor and the ground selection transistor, the erase control voltage being smaller than the erase voltage, and
apply the word-line erase voltage to word-lines of the first stack, word-lines of the second stack and a gate of each of the plurality of intermediate switching transistors.

7. The nonvolatile memory device of claim 5, wherein the control circuit is configured to control the voltage generator and the address decoder to
apply the second high voltage ramping to a first target level to the gate of the second pass transistor,
apply the first high voltage ramping to a second target level, smaller than the first target level, with a delay with respect to the second high voltage,
apply the erase voltage to the drains of the first pass transistor and the second pass transistor,
apply an erase control voltage to a gate of the string selection transistor, the erase control voltage being smaller than the erase voltage,
apply the erase control voltage to a gate of the ground selection transistor,
apply the word-line erase voltage to word-lines of the second stack and a gate of each of the plurality of intermediate switching transistors, and
apply the erase voltage to word-lines of the first stack.

8. The nonvolatile memory device of claim 7, wherein the control circuit is configured to apply the erase control voltage to the gate of the ground selection transistor such that a voltage difference between the common source line and a channel of the second stack is reduced.

9. The nonvolatile memory device of claim 2, further comprising:
a temperature sensor configured to sense the operating temperature of the nonvolatile memory device and to provide the control circuit with a temperature signal corresponding to the operating temperature, and
wherein the control circuit is configured to
convert the temperature signal to a temperature code, and
control the voltage generator to adjust the levels of the first high voltage and the second high voltage based on the temperature code.

10. The nonvolatile memory device of claim 9, wherein the control circuit, based on the temperature code, is configured to control the voltage generator such that the levels of the first high voltage and the second high voltage, in response to the operating temperature being greater than a reference temperature, is smaller than the levels of the first high voltage and the second high voltage in response to the operating temperature being equal to or smaller than the reference temperature.

11. The nonvolatile memory device of claim 1, further comprising:
a memory cell region including the at least one memory block and a first metal pad; and
a peripheral circuit region including
the control circuit,
a second metal pad, the peripheral circuit region connected to the memory cell region through the second metal pad and the first metal pad,
a voltage generator configured to generate word-line voltages including the first high voltage, the second high voltage, the erase voltage and the word-line erase voltage based on control signals from the control circuit, and
an address decoder configured to provide the word-line voltages to the at least one memory block based on a row address, and wherein the address decoder is configured to apply the word-line voltages to the at least one memory block through the second metal pad and the first metal pad.

* * * * *